(12) United States Patent
Lu et al.

(10) Patent No.: US 11,526,647 B2
(45) Date of Patent: Dec. 13, 2022

(54) ISOLATION CIRCUIT BETWEEN POWER DOMAINS

(71) Applicant: TAIWAN SEMICONDUCTOR MANUFACTURING COMPANY, LTD., Hsinchu (TW)

(72) Inventors: Chi-Yu Lu, Hsinchu (TW); Ting-Wei Chiang, Hsinchu (TW); Hui-Zhong Zhuang, Hsinchu (TW); Jerry Chang Jui Kao, Hsinchu (TW); Pin-Dai Sue, Hsinchu (TW); Jiun-Jia Huang, Hsinchu (TW); Yu-Ti Su, Hsinchu (TW); Wei-Hsiang Ma, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 23 days.

(21) Appl. No.: 17/115,436

(22) Filed: Dec. 8, 2020

(65) Prior Publication Data

US 2021/0089700 A1  Mar. 25, 2021

Related U.S. Application Data

(62) Division of application No. 16/549,983, filed on Aug. 23, 2019, now Pat. No. 10,867,104.

(60) Provisional application No. 62/726,153, filed on Aug. 31, 2018.

(51) Int. Cl.
| | |
|---|---|
| *G06F 30/394* | (2020.01) |
| *G03F 1/70* | (2012.01) |
| *G03F 1/36* | (2012.01) |
| *G06F 30/398* | (2020.01) |

(52) U.S. Cl.
CPC .............. *G06F 30/394* (2020.01); *G03F 1/36* (2013.01); *G03F 1/70* (2013.01); *G06F 30/398* (2020.01)

(58) Field of Classification Search
CPC ........ G06F 30/394; G06F 30/398; G03F 1/36; G03F 1/70; H01L 29/1037; H01L 27/0207; H01L 27/092; H01L 21/823878
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,446,196 B1 * | 10/2019 | Narasimhan | ........... G11C 5/147 |
| 2006/0289945 A1 | 12/2006 | Nii | |

(Continued)

*Primary Examiner* — Nha T Nguyen
(74) *Attorney, Agent, or Firm* — Hauptman Ham, LLP

(57) ABSTRACT

An integrated circuit includes a first type-one transistor, a second type-one transistor, a first type-two transistor, a second type-two transistor, a third type-one transistor, a fourth type-one transistor, and a fifth type-one transistor. The first type-one transistor has a gate configured to have a first supply voltage of a first power supply. The first type-two transistor has a gate configured to have a second supply voltage of the first power supply. The first active-region of the third type-one transistor is connected with an active-region of the first type-one transistor. The second active-region and the gate of the third type-one transistor are connected together. The first active-region of the fifth type-one transistor is connected with the gate of the third type-one transistor. The second active-region of the fifth type-one transistor is configured to have a first supply voltage of a second power supply.

20 Claims, 27 Drawing Sheets

(56) References Cited

U.S. PATENT DOCUMENTS

| | | |
|---|---|---|
| 2009/0091970 A1 | 4/2009 | Nii |
| 2011/0006361 A1* | 1/2011 | Darwish ............. H01L 29/7816 |
| | | 257/329 |
| 2012/0306013 A1 | 12/2012 | Donovan et al. |
| 2013/0169330 A1 | 7/2013 | Ma |
| 2014/0040838 A1 | 2/2014 | Liu et al. |
| 2014/0183647 A1 | 7/2014 | Lu et al. |
| 2015/0143309 A1* | 5/2015 | De Dood .............. G06F 30/398 |
| | | 716/107 |
| 2015/0278429 A1 | 10/2015 | Chang |
| 2017/0336840 A1* | 11/2017 | Sahu ..................... G06F 1/3206 |
| 2017/0336845 A1* | 11/2017 | Raj ..................... H01L 23/5286 |
| 2019/0123741 A1* | 4/2019 | Okamoto ............ H03K 17/122 |
| 2019/0211475 A1* | 7/2019 | Ito ......................... G06F 30/327 |

\* cited by examiner

ISOLATION CIRCUIT BETWEEN POWER DOMAINS

PRIORITY CLAIM

The present application is a divisional of U.S. application Ser. No. 16/549,983, filed Aug. 23, 2019, which claims the priority of U.S. Provisional Application No. 62/726,153, filed Aug. 31, 2018, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in more strict restriction on the layout design of the IC circuits. During the layout design of the IC circuits, functional or physical cells are often placed in a circuit layout and routed to form functional circuits. Functional circuits include transistors having channel regions and active regions formed in active zones. Some functional circuits are implemented in different power domains.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
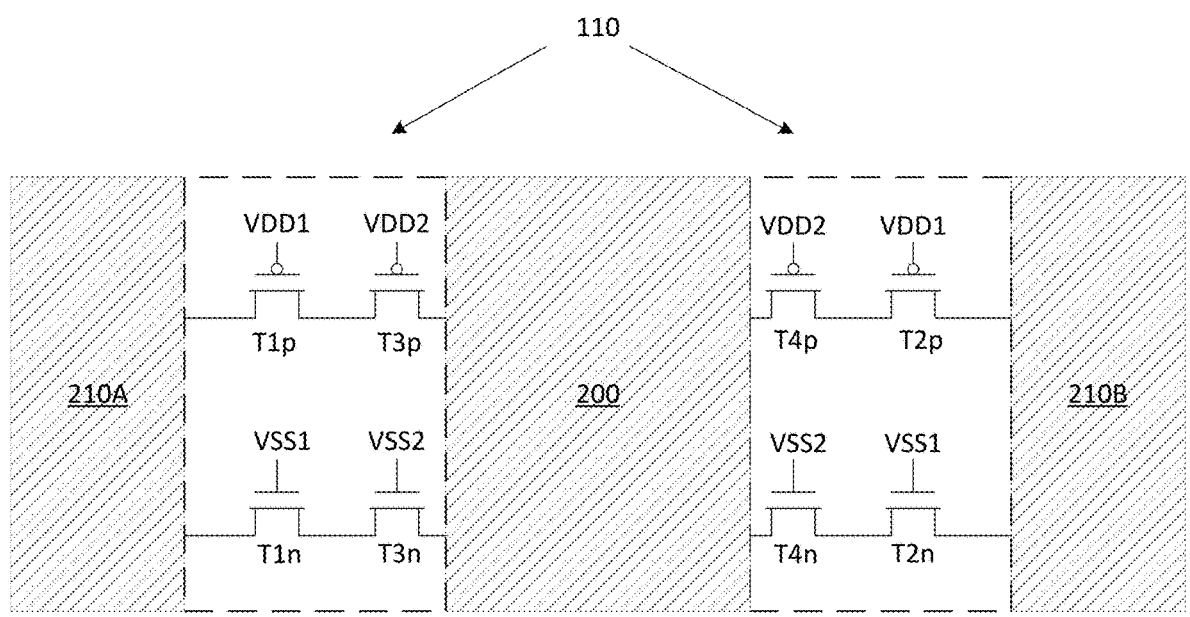
FIG. 1A is a schematic diagram of a cross-domain isolation circuit having isolation structures between power domains, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic diagram of a cross-domain isolation circuit 110 having isolation structures between power domains, in accordance with some embodiments. In FIG. 1A, the cross-domain isolation circuit 110 includes two p-type transistors (e.g., T1p and T3p) connected in series and two n-type transistors (e.g., T1n and T3n) connected in series near the interface between the circuit 200 and the circuit 210A. The cross-domain isolation circuit 110 also includes two p-type transistors (e.g., T2p and T4p) connected in series and two n-type transistors (e.g., T2n and T4n) connected in series near the interface between the circuit 200 and the circuit 210B.

The semiconductor channels of the p-type transistors T1p and T3p are maintained at non-conductive state to isolate the part of the p-type active zone in the circuit 200 from the part of the p-type active zone in the circuit 210A. The semiconductor channels of the n-type transistors T1n and T3n are maintained at non-conductive state to isolate the part of the n-type active zone in the circuit 200 from the part of the n-type active zone in the circuit 210A. The semiconductor channels of the p-type transistors T2p and T4p are maintained at non-conductive state to isolate the part of the p-type active zone in the circuit 200 from the part of the p-type active zone in the circuit 210B. The semiconductor channels of the n-type transistors T2n and T4n are maintained at non-conductive state to isolate the part of the n-type active zone in the circuit 200 from the part of the n-type active zone in the circuit 210B.

In some embodiments, the circuit 210A is in a first power domain powered by a first power supply, the circuit 200 is in a second power domain powered by a second power supply, and the circuit 210B is in a third power domain powered by a third power supply. In general, the first power supply includes an upper supply voltage VDD1 and a lower supply voltage VSS1, the second power supply includes an upper supply voltage VDD2 and a lower supply voltage VSS2, and the third power supply includes an upper supply voltage VDD3 and a lower supply voltage VSS3. In the specific example of FIG. 1A, the upper supply voltage VDD3 in the third power domain is equal to the upper supply voltage VDD1 in the first power domain, and the lower supply voltage VSS3 in the third power domain is equal to the lower supply voltage VSS1 in the first power domain.

In some embodiments, as shown in FIG. 1A, the gates of the p-type transistors T1p and T2p are held at the upper supply voltage VDD1 of the first power supply, and the gates of the n-type transistors T1n and T2n are held at the lower supply voltage VSS1 of the first power supply. In some embodiments, the gates of the p-type transistors T3p and T4p are held at the upper supply voltage VDD2 of the second power supply, and the gates of the n-type transistors T3n and T4n are held at the lower supply voltage VSS2 of the second power supply.

Figure 1B:
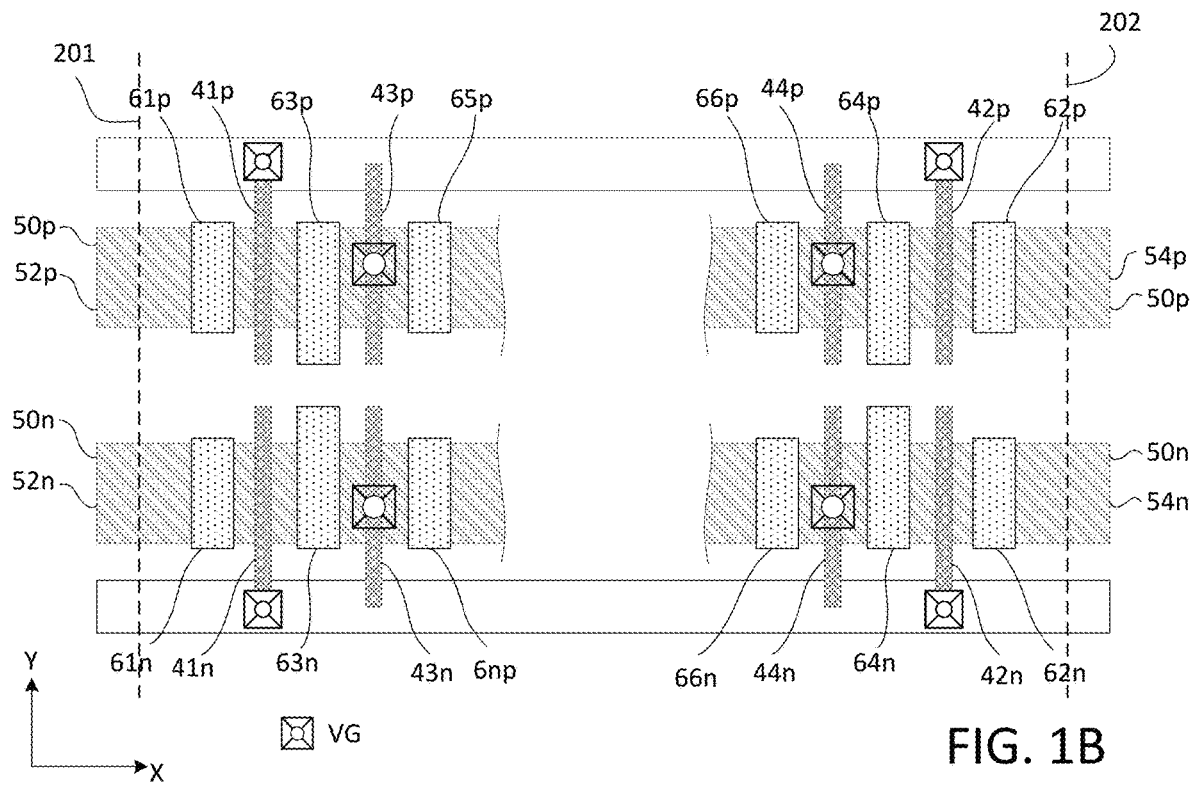
FIG. 1B and FIG. 1C are schematic diagrams of a layout design of the cross-domain isolation circuit of FIG. 1A, in accordance with some embodiments.
Figure 1C:
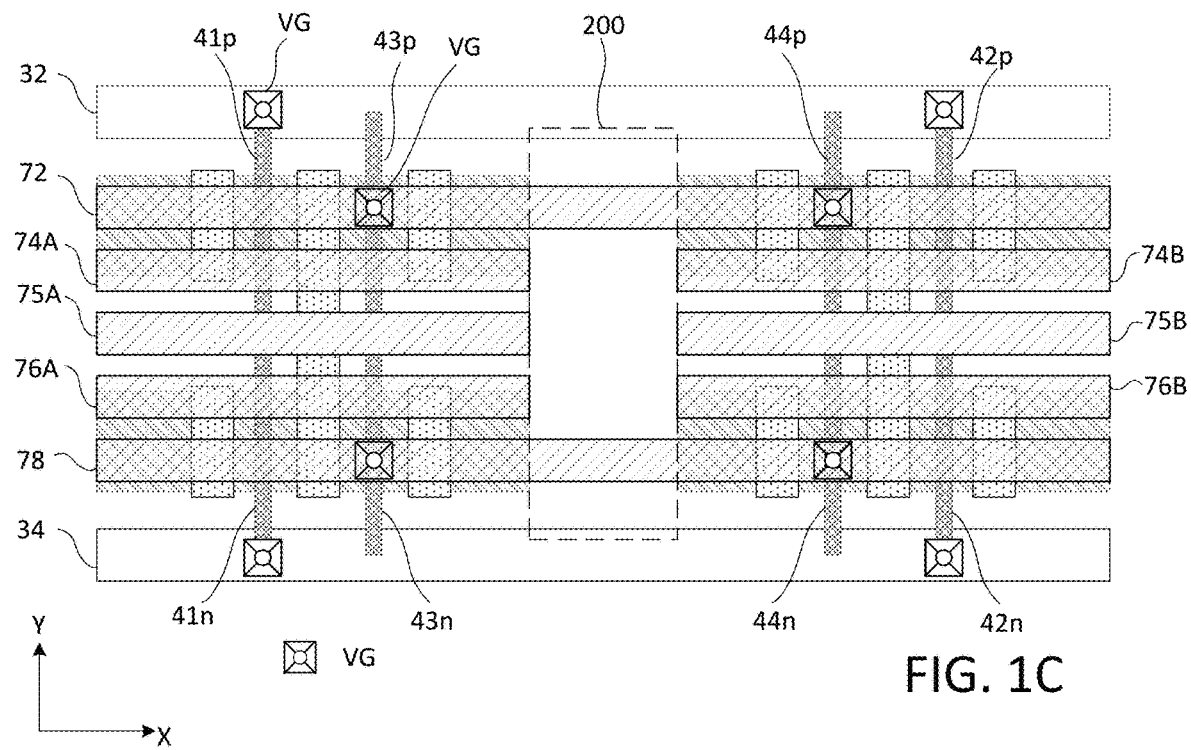

FIG. 1B and FIG. 1C are schematic diagrams of a layout design of the cross-domain isolation circuit 110 in FIG. 1A, in accordance with some embodiments. In FIG. 1B, elements below the first metal layer for routing lines are shown in corresponding layout patterns. The elements in FIG. 1B includes the active zones, the gate-strips, and the conductive segments in the middle layer that is between the first metal layer and the substrate. In FIG. 1C, routing lines in the first metal layer and routing lines in the second metal layer above the first metal layer are shown in corresponding layout patterns, while the layout patterns in FIG. 1C for specifying the elements below the first metal layer are shown as faint background. Vias VG for connecting the gate-strips to the routing lines are shown in both FIG. 1B and FIG. 1C for aiding the alignment of the schematic diagrams in FIGS. 1B-1C.

In FIGS. 1B-1C, the cross-domain isolation circuit 110 includes a p-type active zone 50p and an n-type active zone 50n forming two parallel active zones each extending in the X-direction. Each of the p-type active zone 50p and the n-type active zone 50n crosses a boundary between two circuits of different power domains (e.g., in FIG. 1A, the circuit 210A in the first power domain, the circuit 200 in the second power domain, and the circuit 210B in the third power domain). The first portion 52p of the p-type active zone and the first portion 52n of the n-type active zone 50n extend continuously from the circuit 200 to the circuit 210A. The second portion 54p of the p-type active zone and the second portion 54n of the n-type active zone extend continuously from the circuit 200 to the circuit 210B. In some embodiments, the first portion 52p of the p-type active zone, the second portion 54p of the p-type active zone, the first portion 52n of the n-type active zone, and the second portion 54n of the n-type active zone are fabricated in the active zones which do not break at the boundary (e.g., 201 and 202 in FIG. 1B) between two abutting cells for constructing a functional circuit. In some embodiments, each of the p-type active zone and the n-type active zone are in the form of a continuous oxide diffusion (CNOD) zone.

In FIGS. 1B-1C, the cross-domain isolation circuit 110 includes gate-strips (e.g., 41p-44p and 41n-44n) extending in the Y-direction and conductive segments (e.g., 61p-66p and 61n-66n) extending in the Y-direction.

The p-type transistors T1p and T3p are formed in the first portion 52p of the p-type active zone 50p. The channel region of the p-type transistor T1p is formed under an intersection between the gate-strip 41p and the first portion 52p of the p-type active zone. The channel region of the p-type transistor T3p is formed under an intersection between the gate-strip 43p and the first portion 52p of the p-type active zone. The p-type transistors T2p and T4p are formed in the second portion 54p of the p-type active zone 50p. The channel region of the p-type transistor T2p is formed under an intersection between the gate-strip 42p and the second portion 54p of the p-type active zone. The channel region of the p-type transistor T4p is formed under an intersection between the gate-strip 44p and the second portion 54p of the p-type active zone.

The p-type transistor T3p has a first active-region (under conductive segment 63p) conductively connected with an active-region of the p-type transistors T1p. The p-type transistor T4p has a first active-region (under conductive segment 64p) conductively connected with an active-region of the p-type transistors T2p.

The n-type transistors T1n and T3n are formed in the first portion 52n of the n-type active zone 50n. The channel region of the n-type transistor T1n is formed under an intersection between the gate-strip 41n and the first portion 52n of the n-type active zone. The channel region of the n-type transistor T3n is formed under an intersection between the gate-strip 43n and the first portion 52n of the n-type active zone. The n-type transistors T2n and T4n are formed in the second portion 54n of the n-type active zone 50n. The channel region of the n-type transistor T2n is formed under an intersection between the gate-strip 42n and the second portion 54n of the n-type active zone. The channel region of the n-type transistor T4n is formed under an intersection between the gate-strip 44n and the second portion 54n of the n-type active zone.

The n-type transistor T3n has a first active-region (under conductive segment 63n) conductively connected with an active-region of the n-type transistors T1n. The n-type transistor T4n has a first active-region (under conductive segment 64n) conductively connected with an active-region of the n-type transistors T2n.

In FIGS. 1B-1C, the cross-domain isolation circuit 110 includes horizontal routing lines (e.g., 72, 74A, 74B, 75A, 75B, 76A, 76B, and 78) formed in the first metal layer M0. In some embodiments, the power rails 32 and 34 are also formed in the first metal layer M0. The power rail 32 is conducted with the upper supply voltage VDD1 of the first power supply. The power rail 34 is conducted with the lower supply voltage VSS1 of the first power supply. In some embodiments, the upper supply voltage VDD2 of the second power supply is provided to the horizontal routing line 72, and the lower supply voltage VSS2 of the second power supply is provided to the horizontal routing line 78.

In FIGS. 1A-1C, each of the gate-strip 41p and the gate-strip 42p is conductively connected to the power rail 32 through one of the vias VG passing through the insulation between the first metal layer M0 and the corresponding gate-strip. Each of the gate-strip 41n and the gate-strip 42n is conductively connected to the power rail 34 through one of the vias VG passing through the insulation between the first metal layer M0 and the corresponding gate-strip. Because of the connections to the power rails 32 and 34, the gates of the p-type transistors T1p and T2p are held at the upper supply voltage VDD1, and the gates of the n-type transistors T1n and T2n are held at the lower supply voltage VSS1.

In FIGS. 1A-1C, each of the gate-strip 43p and the gate-strip 44p is conductively connected to the horizontal routing line 72 through one of the vias VG passing through the insulation between the first metal layer M0 and the corresponding routing line. Each of the gate-strip 43n and the gate-strip 44n is conductively connected to the horizontal routing line 78 through one of the vias VG passing through the insulation between the first metal layer M0 and the corresponding routing line. Because of the connections to horizontal routing lines 72 and 78, the gates of the p-type transistors T3p and T4p are held at the upper supply voltage VDD2, and the gates of the n-type transistors T3n and T4n are held at the lower supply voltage VSS2.

In FIGS. 1A-1C, the upper supply voltage VDD1 generally is different from the upper supply voltage VDD2, and the lower supply voltage VSS1 generally is different from the lower supply voltage VSS2. In some embodiments, the lower supply voltage VSS1 is identical to the lower supply voltage VSS2, while the upper supply voltage VDD1 is different from the upper supply voltage VDD2. In some embodiments, the upper supply voltage VDD1 is identical to the upper supply voltage VDD2, while the lower supply voltage VSS1 is different from the lower supply voltage VSS2.

Figure 2A:
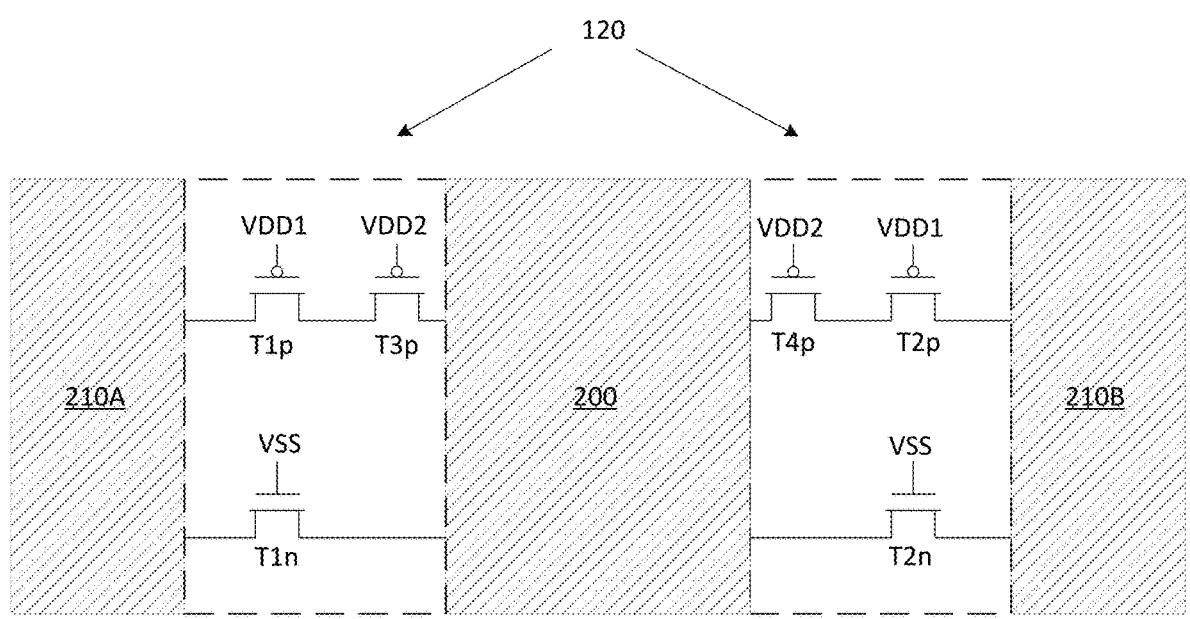
FIG. 2A is a schematic diagram of another cross-domain isolation circuit, in accordance with some embodiments.
Figure 2B:
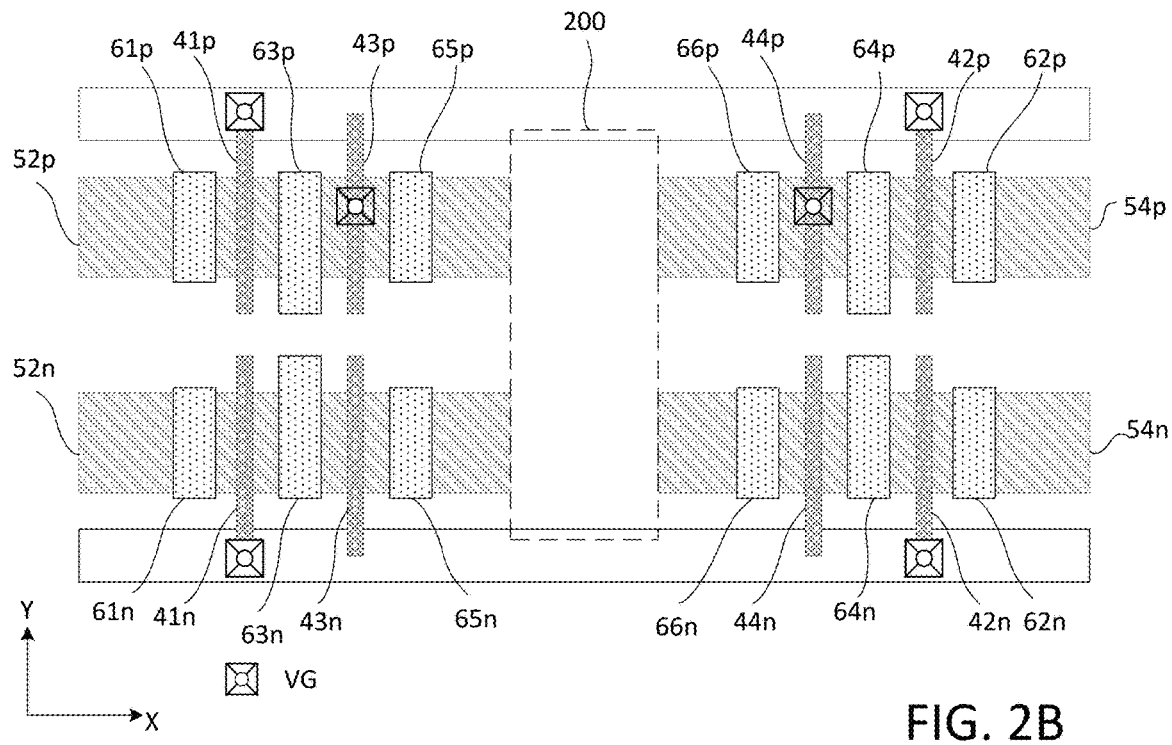
FIG. 2B and FIG. 2C are schematic diagrams of a layout design of the cross-domain isolation circuit of FIG. 2A, in accordance with some embodiments.
Figure 2C:
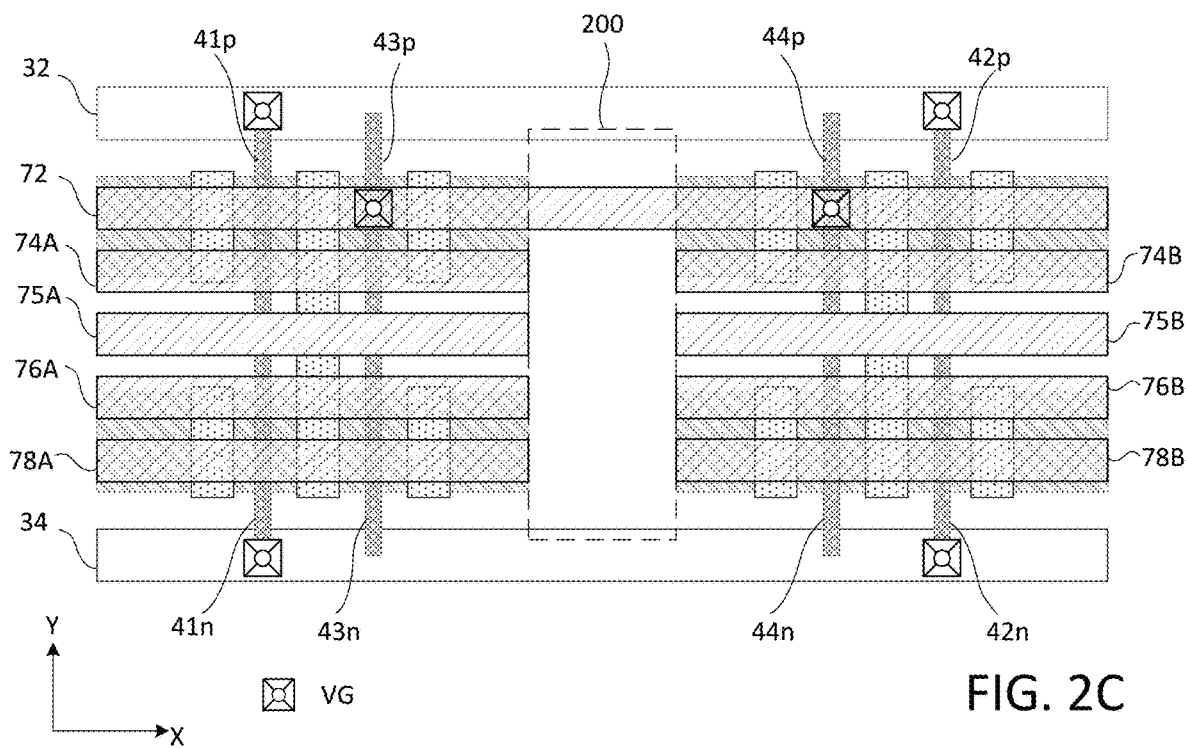

FIG. 2A is a schematic diagram of a cross-domain isolation circuit 120 that is a modification of the cross-domain isolation circuit 110 in FIG. 1A, in accordance with some embodiments. In FIG. 2A, the lower supply voltage VSS1 and the lower supply voltage VSS2 are both equal to a common lower supply voltage VSS. FIG. 2B and FIG. 2C are schematic diagrams of a layout design of the cross-domain isolation circuit 120 in FIG. 2A, in accordance with some embodiments.

In FIG. 2A-2C, the implementation of the p-type transistors T1p, T2p, T3p, and T4p is similar to that in FIG. 1A-1C. The implementation of the n-type transistors T1n, T2n, T3n, and T4n in FIG. 1A-1C is modified. In FIG. 2A-2C, the cross-domain isolation circuit 120 includes the n-type transistor T1n and the n-type transistor T2n. The n-type transistor T1n is near the interface between the circuit 200 and the circuit 210A, and the n-type transistor T2n is near the interface between the circuit 200 and the circuit 210B. The gates of the n-type transistors T1n and T2n are held at the common lower supply voltage VSS. The semiconductor channel of the n-type transistor T1n is maintained at non-conductive state to isolate the part of the n-type active zone in the circuit 200 from the part of the n-type active zone in the circuit 210A. The semiconductor channel of the n-type transistors T2n is maintained at non-conductive state to isolate the part of the n-type active zone in the circuit 200 from the part of the n-type active zone in the circuit 210B. In FIG. 2C, each of the gate-strip 43n and the gate-strip 44n has not been connected to a power supply voltage through one of the horizontal routing lines 78A and 78B, which is different from the layout in FIG. 1C.

Figure 3A:
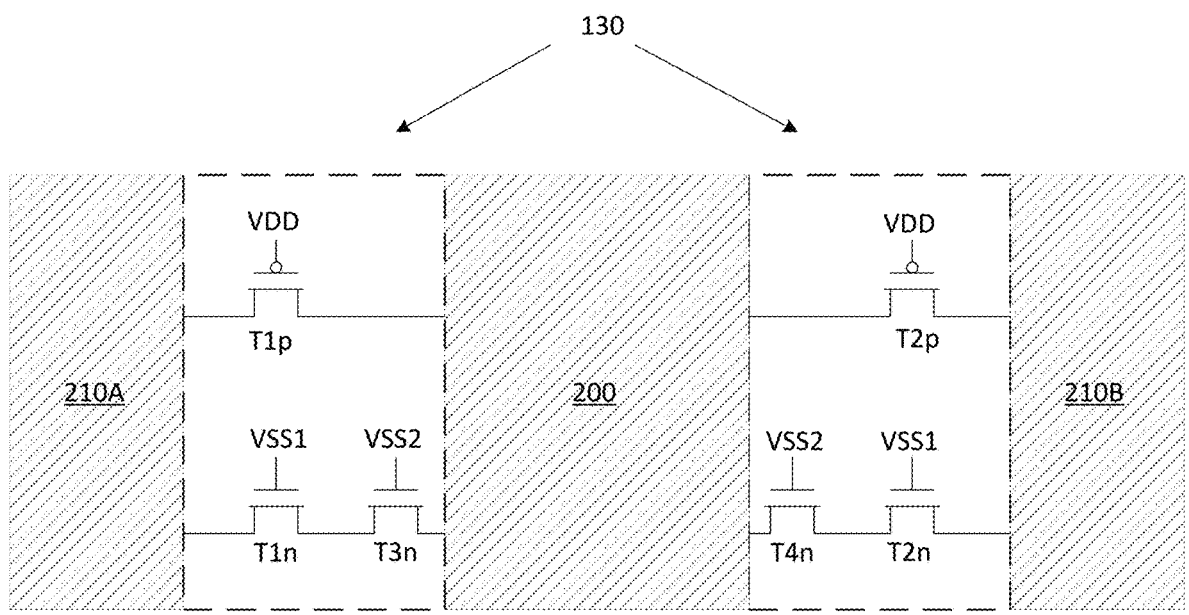
FIG. 3A is a schematic diagram of another cross-domain isolation circuit, in accordance with some embodiments.
Figure 3B:
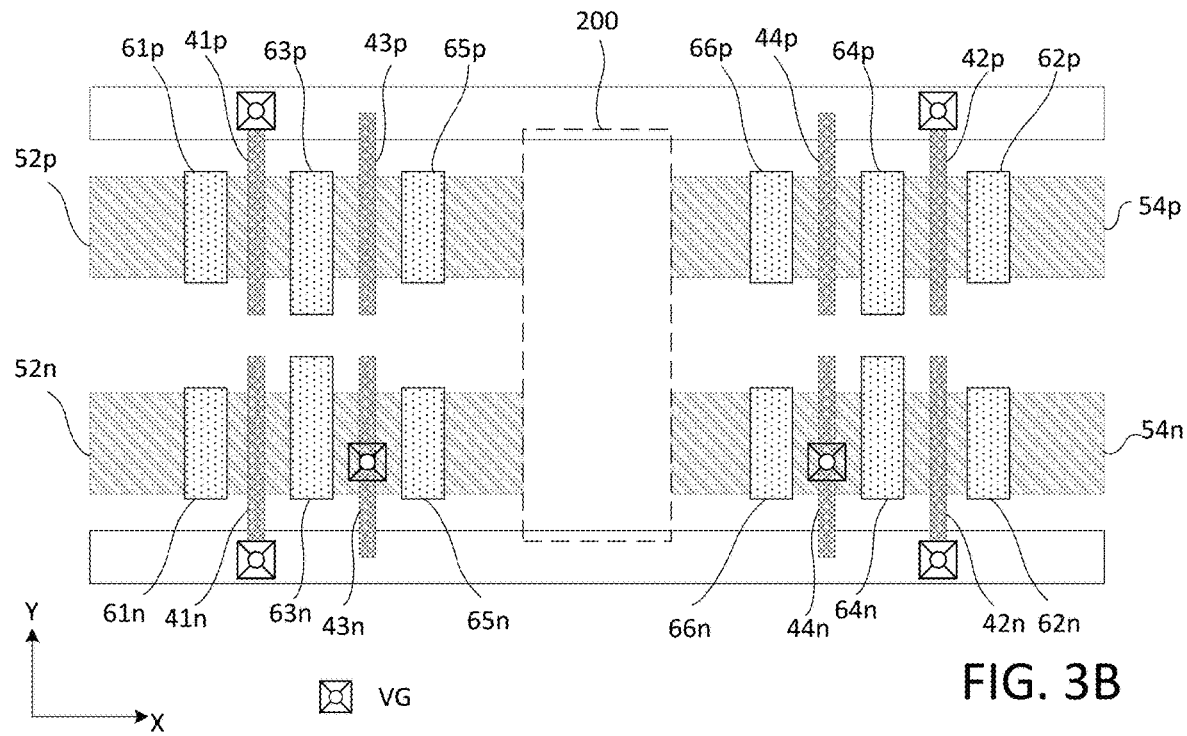
FIG. 3B and FIG. 3C are schematic diagrams of a layout design of the cross-domain isolation circuit of FIG. 3A, in accordance with some embodiments.
Figure 3C:
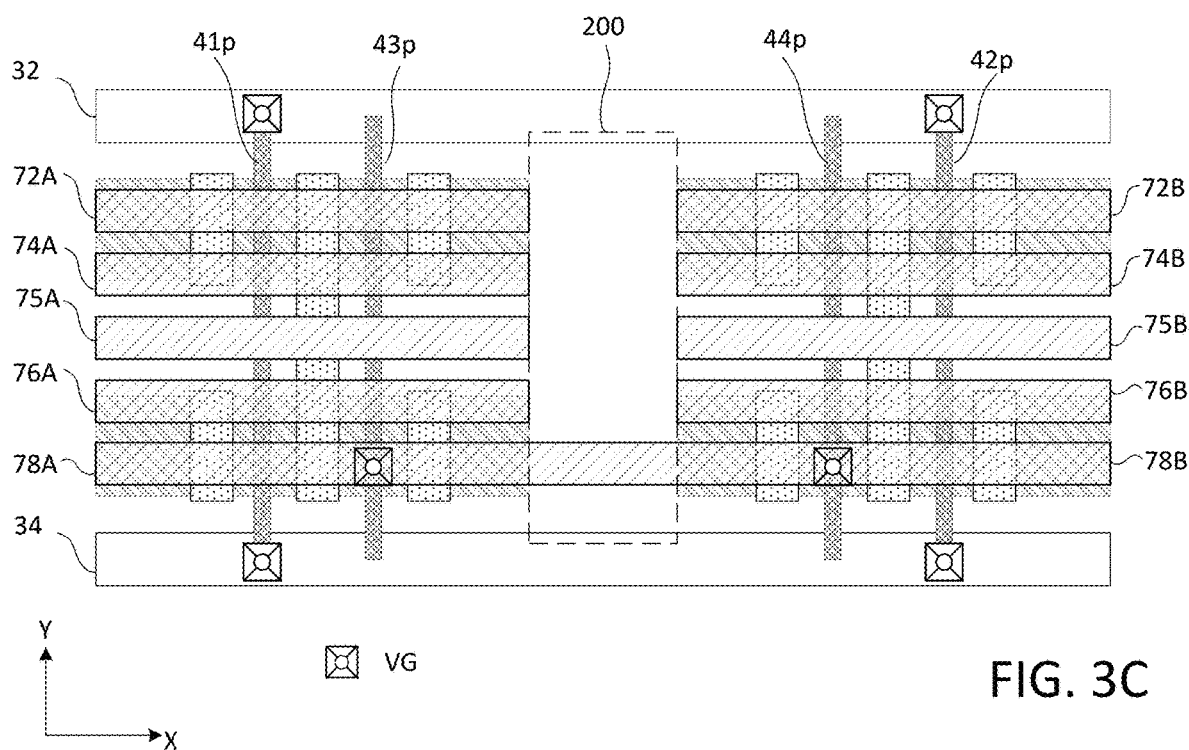

FIG. 3A is a schematic diagram of a cross-domain isolation circuit 130 that is a modification of the cross-domain isolation circuit 110 in FIG. 1A, in accordance with some embodiments. In FIG. 3A, both the upper supply voltage VDD1 is identical to the upper supply voltage VDD2 are both equal to a common upper supply voltage VDD. FIG. 3B and FIG. 3C are schematic diagrams of a layout design of the cross-domain isolation circuit 130 in FIG. 3A, in accordance with some embodiments.

In FIG. 3A-3C, the implementation of the n-type transistors T1n, T2n, T3n, and T4n is similar to that in FIG. 1A-1C. The implementation of the p-type transistors T1n, T2n, T3n, and T4n in FIG. 1A-1C is modified. In FIG. 3A-3C, the cross-domain isolation circuit 120 includes the p-type transistor T1p and the p-type transistor T2p. The p-type transistor T1p is near the interface between the circuit 200 and the circuit 210A, and the p-type transistor T2p is near the interface between the circuit 200 and the circuit 210B. The gates of the p-type transistors T1p and T2p are held at the common lower supply voltage VDD. The semiconductor channel of the p-type transistor T1p is maintained at non-conductive state to isolate the part of the p-type active zone in the circuit 200 from the part of the p-type active zone in the circuit 210A. The semiconductor channel of the p-type transistors T2p is maintained at non-conductive state to isolate the part of the p-type active zone in the circuit 200 from the part of the p-type active zone in the circuit 210B. In FIG. 3C, each of the gate-strip 43n and the gate-strip 44n has not been connected to a power supply voltage through one of the horizontal routing lines 72A and 72B, which is different from the layout in FIG. 1C.

Figure 4A:
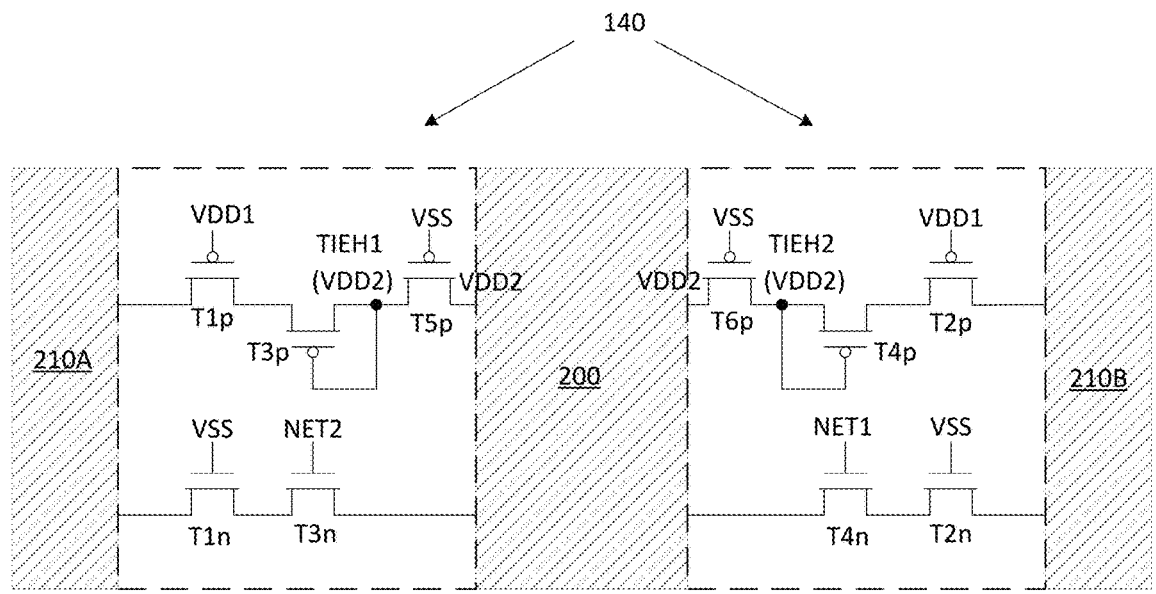
FIG. 4A is a schematic diagram of a cross-domain isolation circuit having antenna enhancement, in accordance with some embodiments.

FIG. 4A is a schematic diagram of a cross-domain isolation circuit 140 having antenna enhancement, in accordance with some embodiments. In FIG. 4A, the upper supply voltage VDD1 of the first power supply is different from the upper supply voltage VDD2 of the second power supply, while the lower supply voltage of the first power supply and the lower supply voltage of the second power supply are equal to a common lower supply voltage VSS.

Figure 4B:
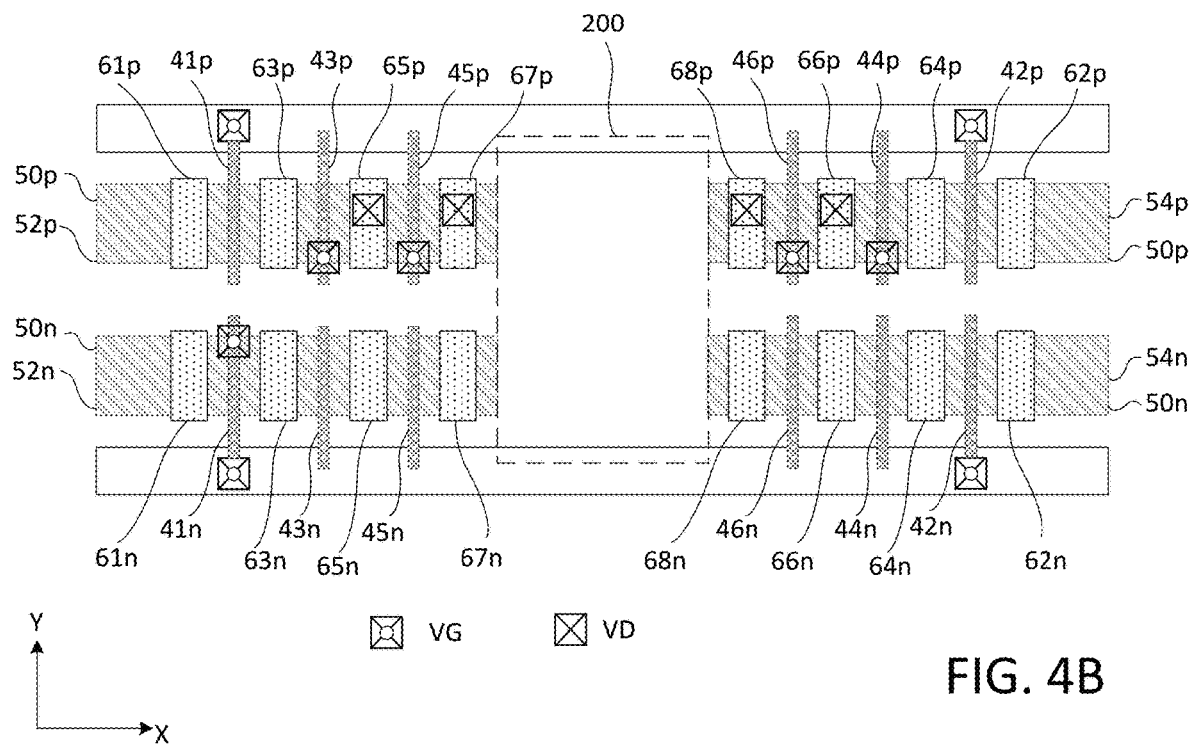
FIGS. 4B-4D are schematic diagrams of a layout design of the cross-domain isolation circuit of FIG. 4A, in accordance with some embodiments.
Figure 4C:
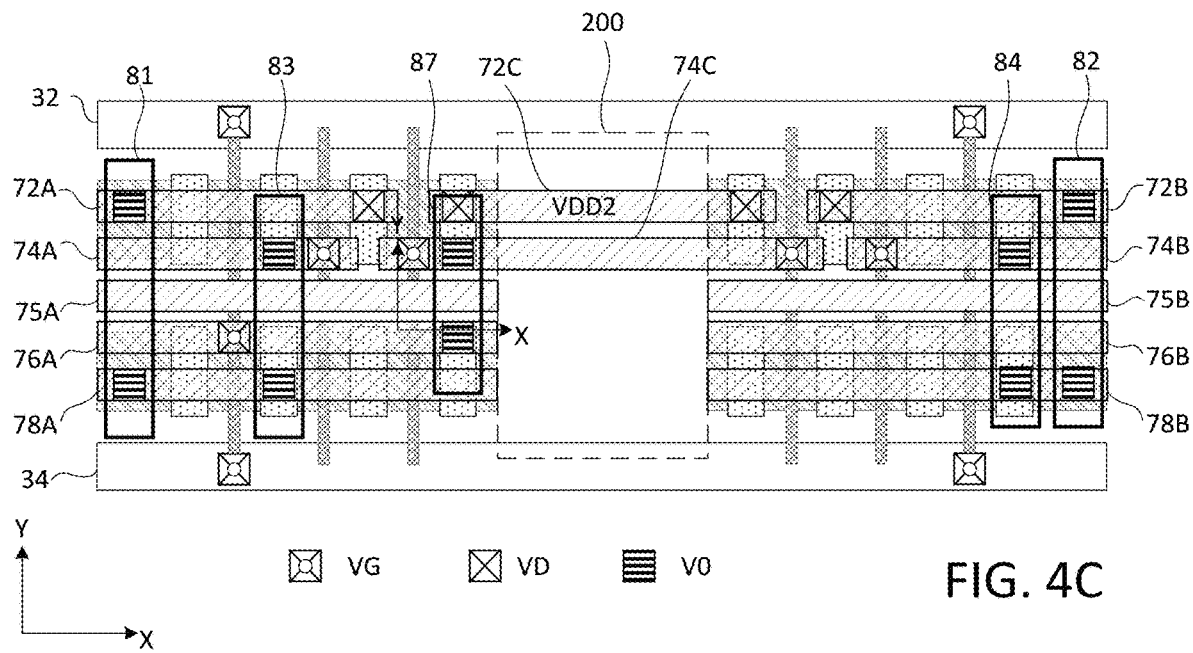
Figure 4D:
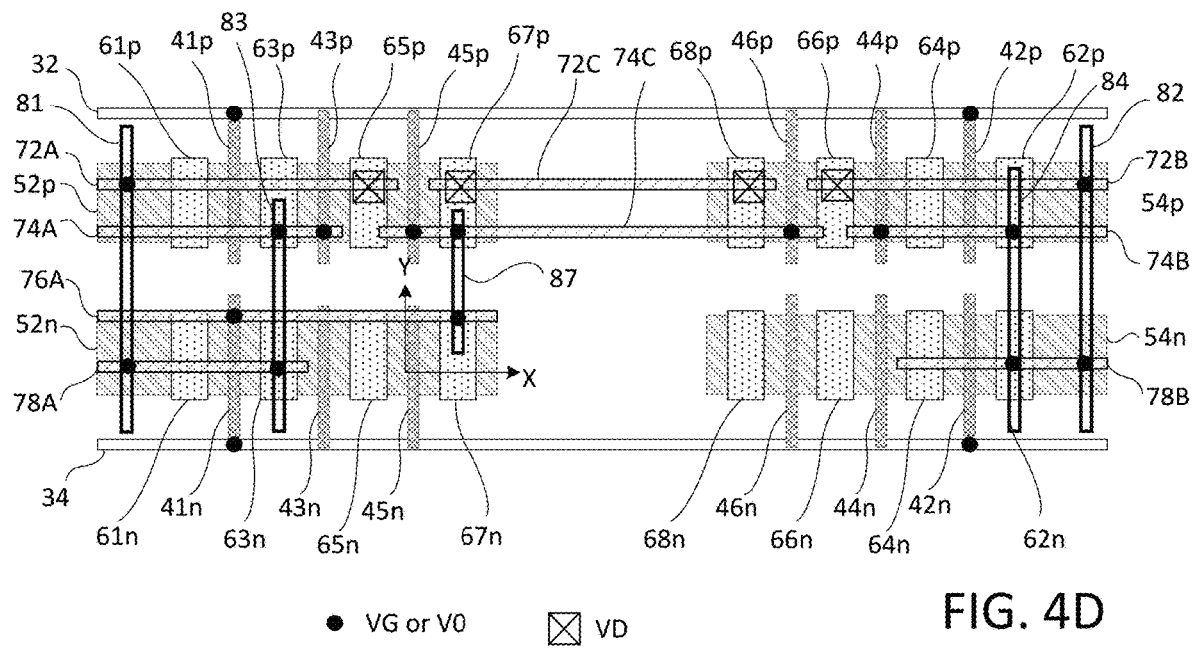

FIGS. 4B-4D are schematic diagrams of a layout design of the cross-domain isolation circuit 140 in FIG. 4A, in accordance with some embodiments. In FIG. 4B, elements below the first metal layer (e.g., the active zones, the gate-strips, and the conductive segments in the middle layer) are shown in corresponding layout patterns. In FIG. 4C, routing lines in the first metal layer and routing lines in the second metal layer above the first metal layer are shown in corresponding layout patterns, while the layout patterns in FIG. 4C for specifying the elements below the first metal layer are shown as faint background. In FIG. 4D, selected routing lines in FIG. 4C for connecting various elements in FIG. 4B are represented with sticks, which are superimposed on the layout patterns in FIG. 4B.

In FIGS. 4B-4D, the cross-domain isolation circuit 140 includes a p-type active zone 50p and an n-type active zone 50n forming two parallel active zones each extending in the X-direction. In some embodiments, the first portion 52p of the p-type active zone, the second portion 54p of the p-type active zone, the first portion 52n of the n-type active zone, and the second portion 54n of the n-type active zone are fabricated in the active zones which do not break at the boundary between two abutting cells for constructing a functional circuit. In some embodiments, each of the p-type active zone and the n-type active zone is in the form of a continuous oxide diffusion (CNOD) zone.

In FIGS. 4B-4D, the cross-domain isolation circuit 140 includes gate-strips 41p-46p and 41n-46n extending in the Y-direction. Underneath the intersection between the p-type active zone 50p and each one of the gate-strip 41p-46p is a corresponding p-type transistor. Underneath the intersection between the n-type active zone 50n and each one of the gate-strip 41n-46n is a corresponding n-type transistor.

The cross-domain isolation circuit 140 includes two n-type transistors (e.g., T1n and T3n) in the first portion 52n of the n-type active zone and two n-type transistors (e.g., T2n and T4n) in the second portion 54n of the n-type active zone. The semiconductor channels of the two n-type transistors (e.g., T1n and T3n) in the first portion 52n are serially connected together. The semiconductor channels of the two n-type transistors (e.g., T2n and T4n) in the second portion 54n are serially connected together.

The cross-domain isolation circuit 140 includes three p-type transistors (e.g., T1p, T3p, and T5p) in the first portion 52p of the p-type active zone and three p-type transistors (e.g., T2p, T4p, and T6p) in the second portion 54p of the p-type active zone. The semiconductor channels of the three p-type transistors (e.g., T1p, T3p, and T5p) in the first portion 52p are serially connected together. The semiconductor channels of three p-type transistors (e.g., T2p, T4p, and T6p) in the second portion 54p are serially connected together.

In FIG. 4B-4D, the cross-domain isolation circuit 140 includes horizontal routing lines (e.g., 72A-72C, 74A-74C, 75A-75B, 76A-76B, and 78A-78B) extending in the X-direction in the first metal layer M0. In some embodiments, the power rails 32 and 34 are also in the first metal layer M0. The power rail 32 is conducted with the upper supply voltage VDD1 of the first power supply. The power rail 34 is conducted with the common lower supply voltage VSS of the first power supply. The upper supply voltage VDD2 of the second power supply is conducted to the horizontal routing line 72C.

In FIGS. 4B-4D, each of the gate-strip 41p and the gate-strip 42p is conductively connected to the power rail 32 through via VG. Each of the gate-strip 41n and the gate-strip 42n is conductively connected to the power rail 34 through via VG. Because of the connections to the power rails 32 and 34, the gates of the p-type transistors T1p and T2p are held at the upper supply voltage VDD1, and the gates of the n-type transistors T1n and T2n are held at the common lower supply voltage VSS. In some embodiments, the gates of the n-type transistors T3n and T4n are correspondingly connected to some signal voltages NET1 and NET2. In some embodiments, the gates of the n-type transistors T3n and T4n are also held at the common lower supply voltage VSS.

In FIG. 4B-4D, the cross-domain isolation circuit 140 includes conductive segments (e.g., 61p-68p and 61n-68n) extending in the Y-direction in a middle layer below the first metal layer M0. In some embodiments, the middle layer is conductive layer formed with metal or doped semiconductor materials. In some embodiments, the middle layer is characterized as a MD layer. The cross-domain isolation circuit 140 also vertical routing lines (e.g., 81-84 and 87) extending in the Y-direction in a second metal layer M1 that is below the first metal layer M0.

In FIG. 4A, the semiconductor channel of the p-type transistor T5p has a first terminal conductively connected with the gate of the p-type transistor T3p and has a second terminal held at the upper supply voltage VDD2. In FIG. 4B-4D, the first terminal of the p-type transistor T5p forms conductive contact with conductive segment 65p, which is conductively connected to the gate-strip 43p through various horizontal routing lines and vertical routing lines. Specifically, the conductive segment 65p is conductively connected to the horizontal routing line 72A through via VD. The horizontal routing line 72A is conductively connected to the vertical routing line 81 through via V0. The vertical routing line 81 is conductively connected to the horizontal routing line 78A through via V0. The horizontal routing line 78A is conductively connected to the vertical routing line 83 through via V0. The vertical routing line 83 is conductively connected to the horizontal routing line 74A through via V0. The horizontal routing line 74A is conductively connected to the gate-strip 43p through via VG. In FIG. 4B-4D, the second terminal of the p-type transistor T5p forms conductive contact with conductive segment 67p, which is conductively connected to the horizontal routing line 72C through via VD, while the horizontal routing line 72C is held at the upper supply voltage VDD2.

In FIG. 4A, the p-type transistor T5p has its gate held at the common lower supply voltage VSS to maintain its semiconductor channel at conducting state. In FIG. 4B-4D, the gate-strip 45p is conductively connected to the gate-strip 41n through various horizontal routing lines and vertical routing lines, while the gate-strip 41n is held at the at the common lower supply voltage VSS. Specifically, the gate-strip 45p is conductively connected to the horizontal routing line 74C through via VG. The horizontal routing line 74C is conductively connected to the vertical routing line 87 through via V0. The vertical routing line 87 is conductively connected to the horizontal routing line 76A through via V0. The horizontal routing line 76A is conductively connected to the gate-strip 41n through via VG. The gate-strip 41n is conductively connected to the power rail 34 through via VD.

In FIG. 4A, the semiconductor channel of the p-type transistor T6p has a first terminal conductively connected with the gate of the p-type transistor T4p and has a second terminal held at the upper supply voltage VDD2. In FIG. 4B-4D, the first terminal of the p-type transistor T6p forms conductive contact with conductive segment 66p, which is conductively connected to the gate-strip 44p through various horizontal routing lines and vertical routing lines. Specifically, the conductive segment 66p is conductively connected to the horizontal routing line 72B through via VD. The horizontal routing line 72B is conductively connected to the vertical routing line 82 through via V0. The vertical routing line 82 is conductively connected to the horizontal routing line 78B through via V0. The horizontal routing line 78B is conductively connected to the vertical routing line 84 through via V0. The vertical routing line 84 is conductively connected to the horizontal routing line 74B through via V0. The horizontal routing line 74B is conductively connected to the gate-strip 44p through via VG. In FIG. 4B-4D, the second terminal of the p-type transistor T6p forms conductive contact with conductive segment 68p, which is conductively connected to the horizontal routing line 72C through via VD, while the horizontal routing line 72C is held at the upper supply voltage VDD2.

In FIG. 4A, the p-type transistor T6p has its gate held at the common lower supply voltage VSS to maintain its semiconductor channel at conducting state. In FIG. 4B-4D, the gate-strip 46p is conductively connected to the horizontal routing line 74C, which is conductively connected to the gate-strip 41n through the vertical routing line 87 and the horizontal routing line 76A, while the gate-strip 41n is held at the at the common lower supply voltage VSS.

Figure 5A:
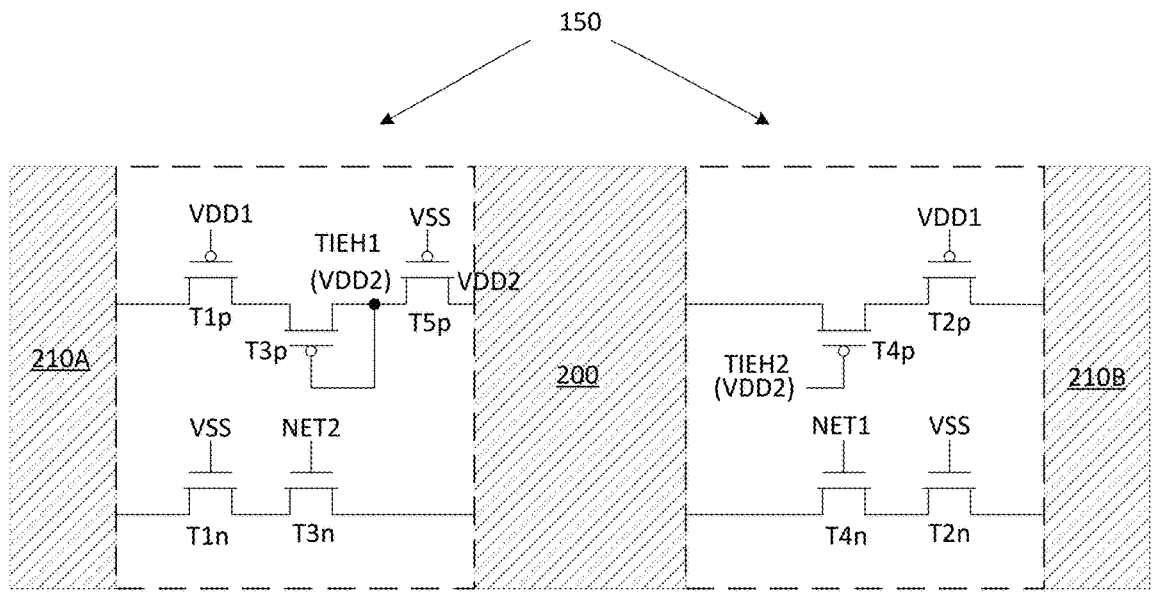
FIG. 5A is a schematic diagram of another cross-domain isolation circuit, in accordance with some embodiments.
Figure 5B:
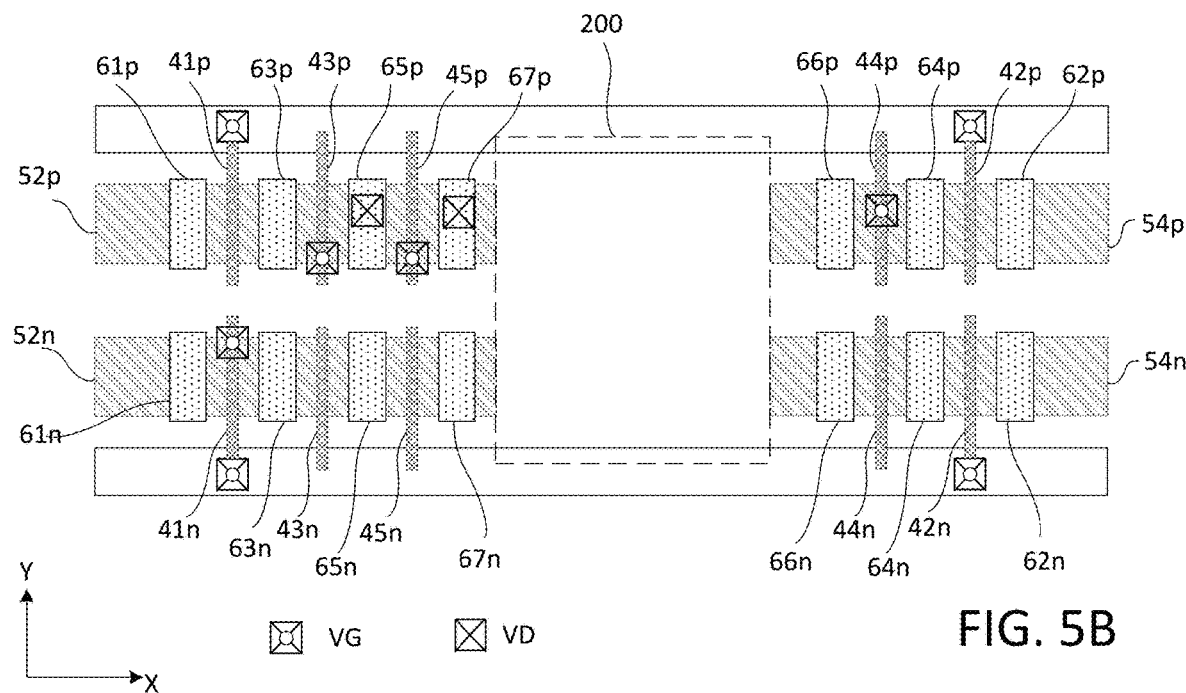
FIGS. 5B-5D are schematic diagrams of a layout design of the cross-domain isolation circuit of FIG. 5A, in accordance with some embodiments.
Figure 5C:
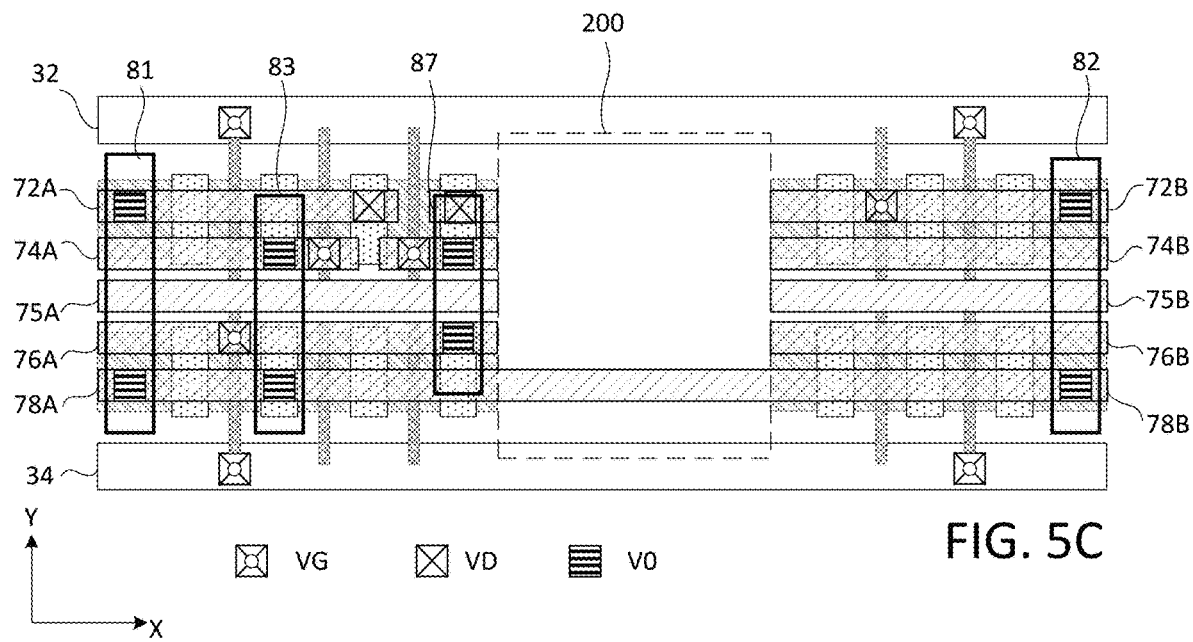
Figure 5D:
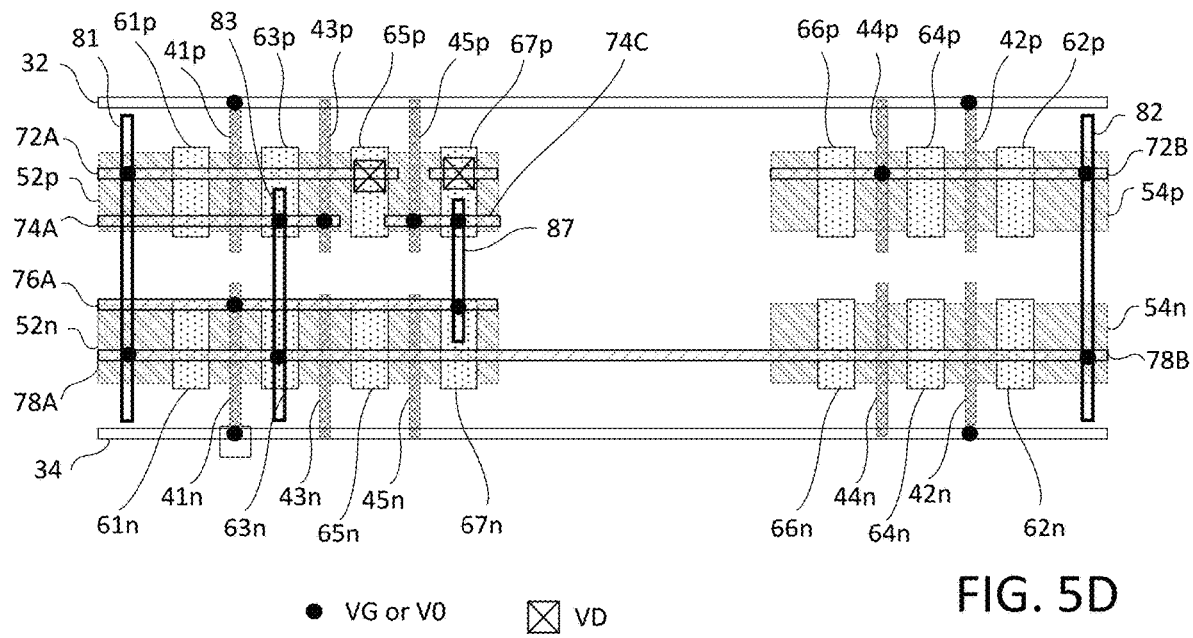

FIG. 5A is a schematic diagram of a cross-domain isolation circuit 150 that is a modification of the cross-domain isolation circuit 140 in FIG. 4A, in accordance with some embodiments. The two p-type transistors T4p and T6p of the cross-domain isolation circuit 140 in FIG. 4A are substituted with one p-type transistors T4p of the cross-domain isolation circuit 150 in FIG. 5. FIGS. 5B-5D are schematic diagrams of a layout design of the cross-domain isolation circuit 150 in FIG. 5A, in accordance with some embodiments.

In FIG. 5A, the gate of the p-type transistor T4p near the boundary of the circuit 210B is conductively connected to the gate of the p-type transistor Tp3 near the boundary of the circuit 210A. The gate of the p-type transistor T3p is conductively connected to the first terminal of the p-type transistor T5p, in both cross-domain isolation circuit 140 of FIG. 4A and the cross-domain isolation circuit 150 of FIG. 5A.

In FIG. 5B-5D, the gate-strip 44p for the p-type transistor T4p is conductively connected to the gate-strip 43p for the p-type transistor T3p through various horizontal routing lines and vertical routing lines. Specifically, the gate-strip 44p is conductively connected to the horizontal routing line 72B through via VG. The horizontal routing line 72B is conductively connected to the vertical routing line 82 through via V0. The vertical routing line 82 is conductively connected to the horizontal routing line 78B through via V0. The horizontal routing line 78B is joint with the horizontal routing line 78A. The horizontal routing line 78A is conductively connected to the vertical routing line 83 through via V0. The vertical routing line 81 is conductively connected to the horizontal routing line 74A through via V0. The horizontal routing line 74A is conductively connected to the gate-strip 43p through via VG.

Figure 6A:
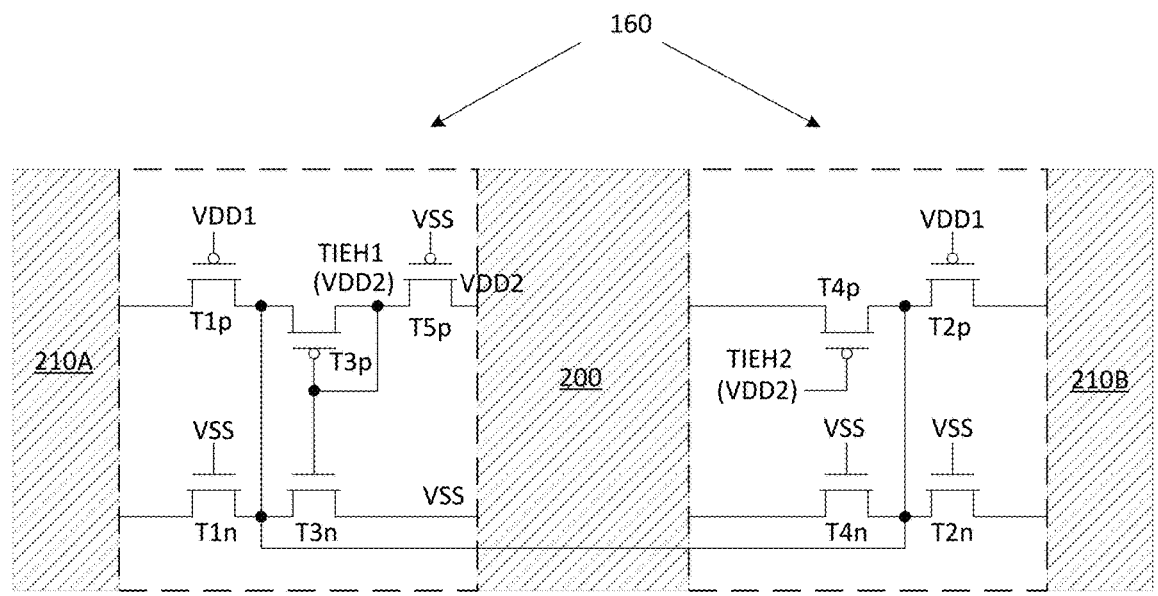
FIG. 6A is a schematic diagram of another cross-domain isolation circuit, in accordance with some embodiments.
Figure 6B:
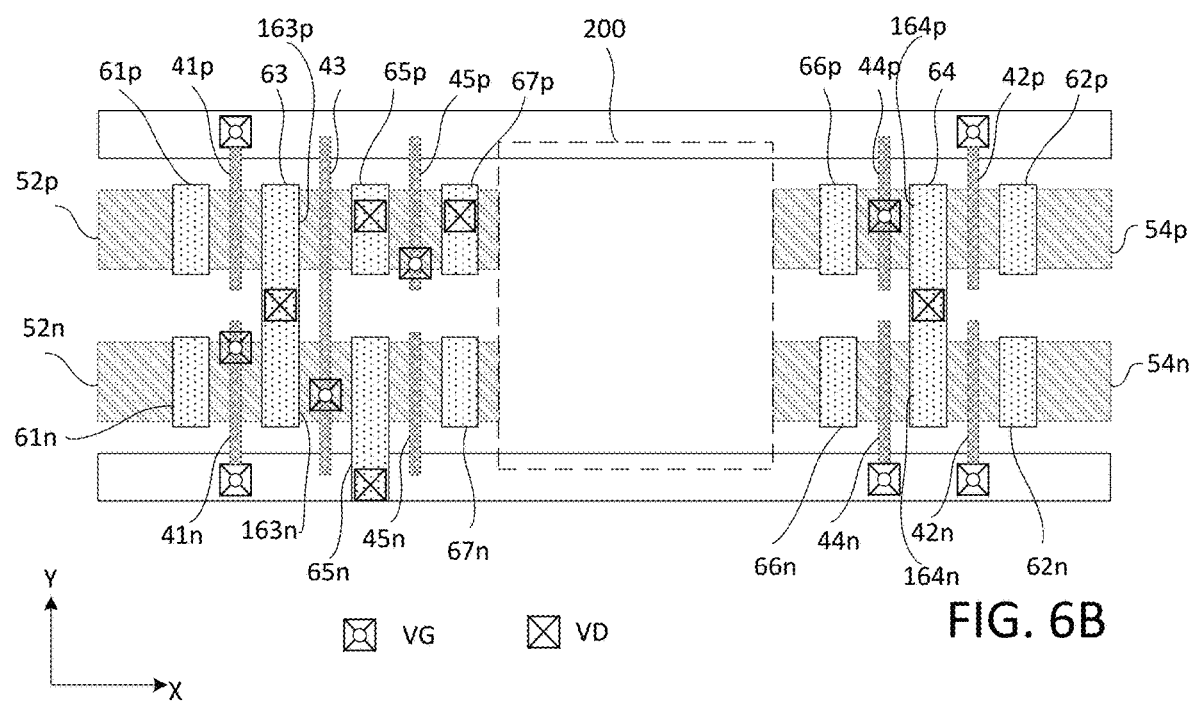
FIGS. 6B-6D are schematic diagrams of a layout design of the cross-domain isolation circuit of FIG. 6A, in accordance with some embodiments.
Figure 6C:
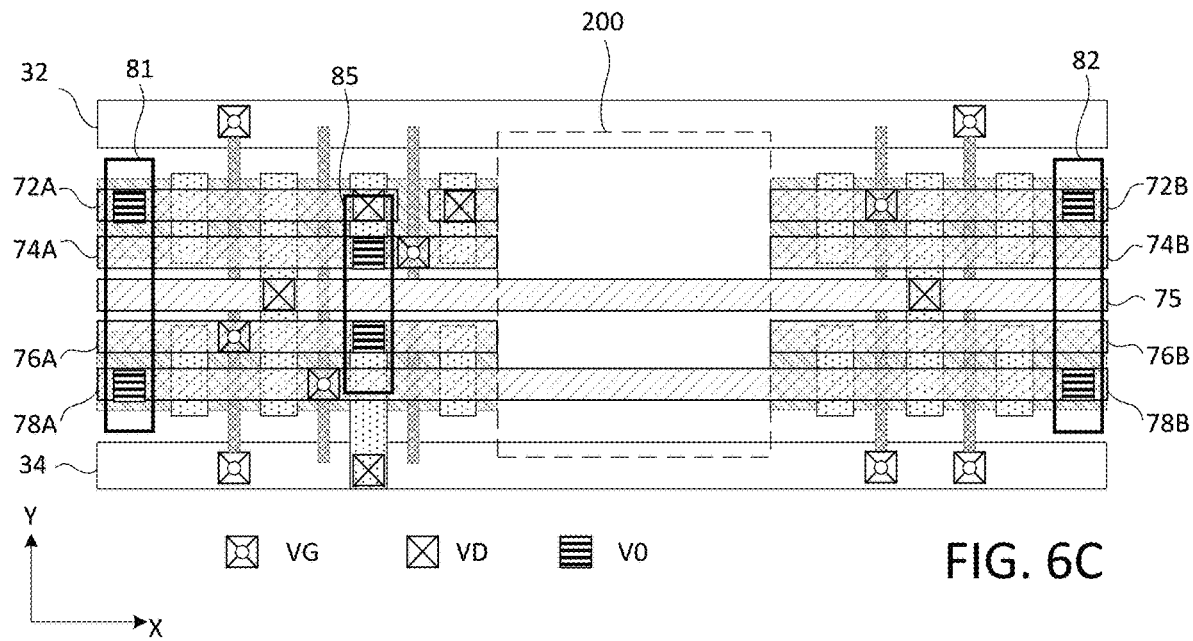
Figure 6D:
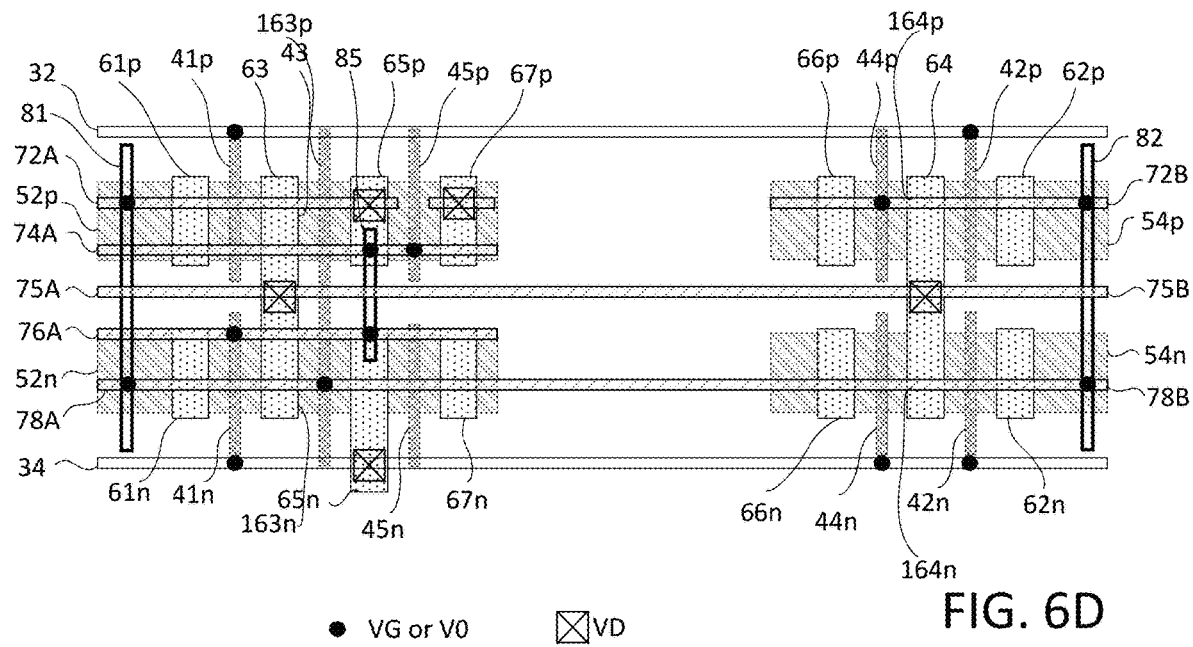

FIG. 6A is a schematic diagram of a cross-domain isolation circuit 160 that is a modification of the cross-domain isolation circuit 150 in FIG. 5A, in accordance with some embodiments. FIGS. 6B-6D are schematic diagrams of a layout design of the cross-domain isolation circuit 160 in FIG. 6A, in accordance with some embodiments.

In FIG. 6A, the active region connecting the p-type transistors T1p and T3p, the active region connecting the n-type transistors T1n and T3n, the active region connecting the p-type transistors T2p and T4p, and the active region connecting the n-type transistors T2n and T4n are all conductively connected together. Specifically, in FIG. 6B-6D, the conductive segment 63 forms conductive contact with the active region 163p between the transistors T1p and T3p over the p-type active zone and forms conductive contact with the active region 163n between the transistors T1n and T3n over the n-type active zone. The conductive segment 64 forms conductive contact with the active region 164p between the transistors T2p and T4p over the p-type active zone and forms conductive contact with the active region 164n between the transistors T2n and T4n over the n-type active zone. Each of the conductive segments 63 and 64 is conductively connected to the horizontal routing line 75 through via VD.

In FIG. 6A, the gate of the p-type transistors T3p and the gate of the n-type transistors T3n are conductively connected together. Specifically, in FIG. 6B-6D, the gate of the p-type transistors T3p and the gate of the n-type transistors T3n are conductively connected together by the gate-strip 43. The gates of the p-type transistors T3p and the n-type transistors T3n are all connected to the node TIEH1 between the transistors T3p and T5p, when the gate-strip 43 is conductively connected to the horizontal routing line 78A through via VG.

In FIG. 6A, the semiconductor channel of the n-type transistor T3n has a first terminal conductively connected to a terminal of the semiconductor channel in the n-type transistor T1n. The semiconductor channel of the n-type transistor T3n has a second terminal held at the common lower supply voltage VSS. Specifically, in FIG. 4B-4D, the second terminal of the n-type transistor T3n forms conductive contact with the conductive segment 65n, which is conductively connected to the power rail 34 through via VD.

In FIG. 6A, the gate of the n-type transistors T4n is held at the common lower supply voltage VSS. Specifically, in FIG. 4B-4D, the gate-strip 44n is conductively connected to the power rail 34 through via VG.

Figure 7A:
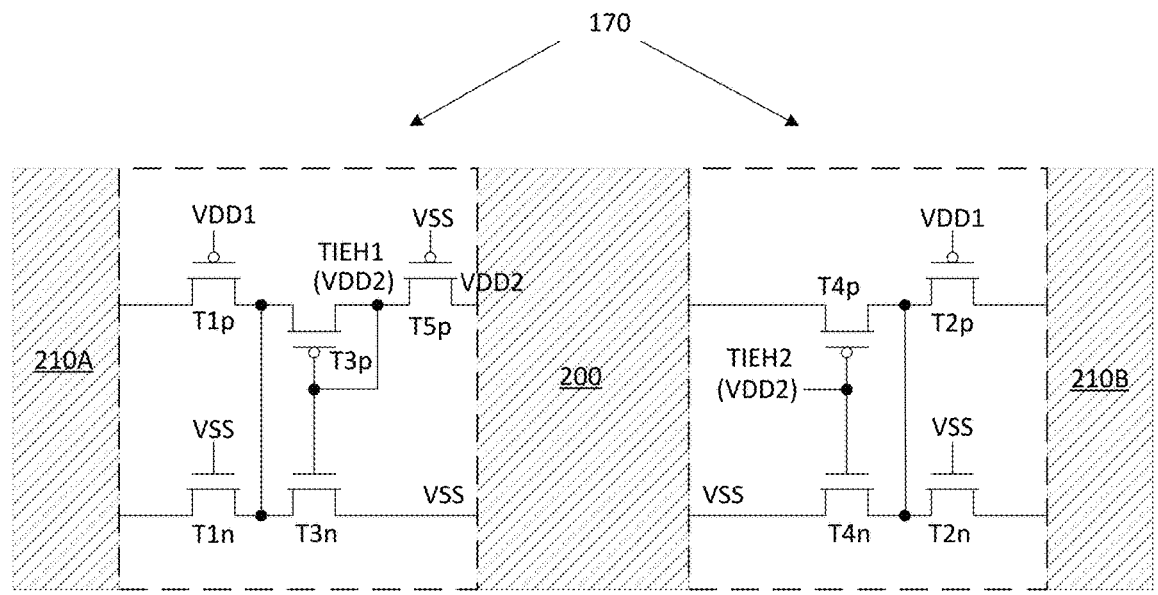
FIG. 7A is a schematic diagram of another cross-domain isolation circuit, in accordance with some embodiments.
Figure 7B:
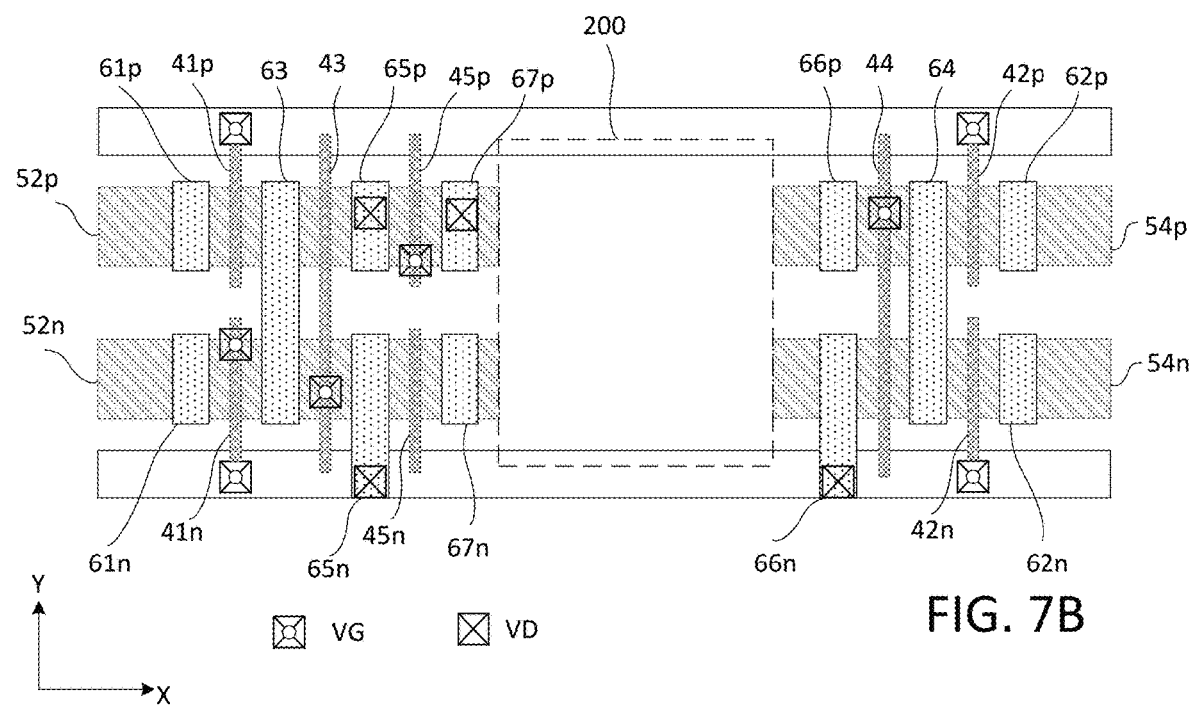
FIGS. 7B-7D are schematic diagrams of a layout design of the cross-domain isolation circuit of FIG. 7A, in accordance with some embodiments.
Figure 7C:
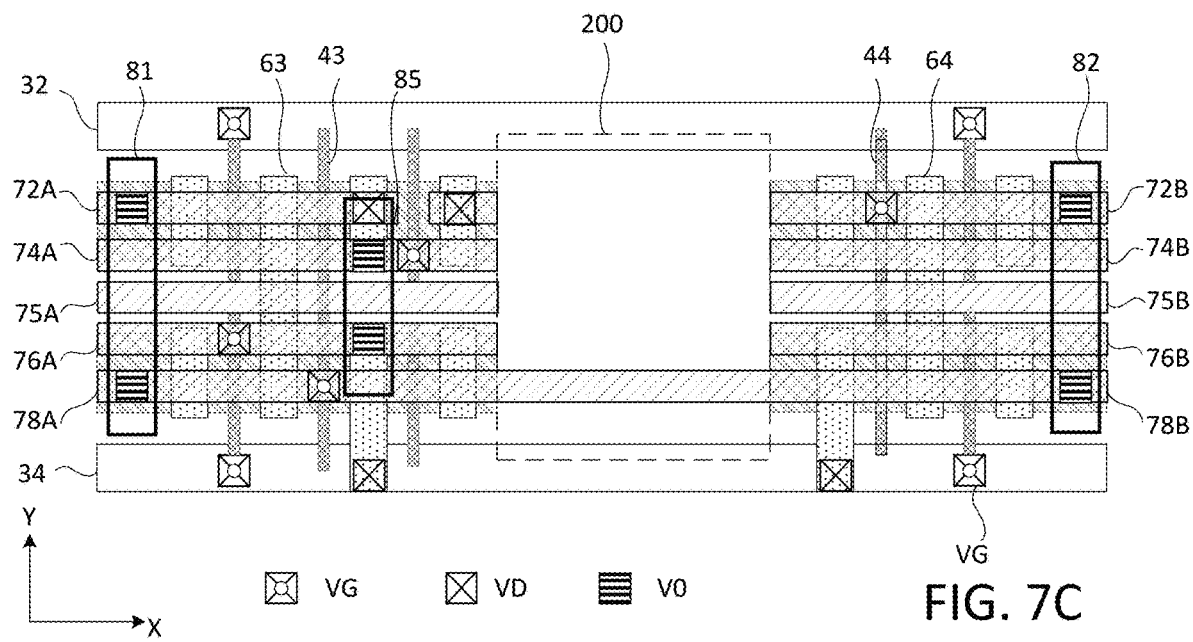
Figure 7D:
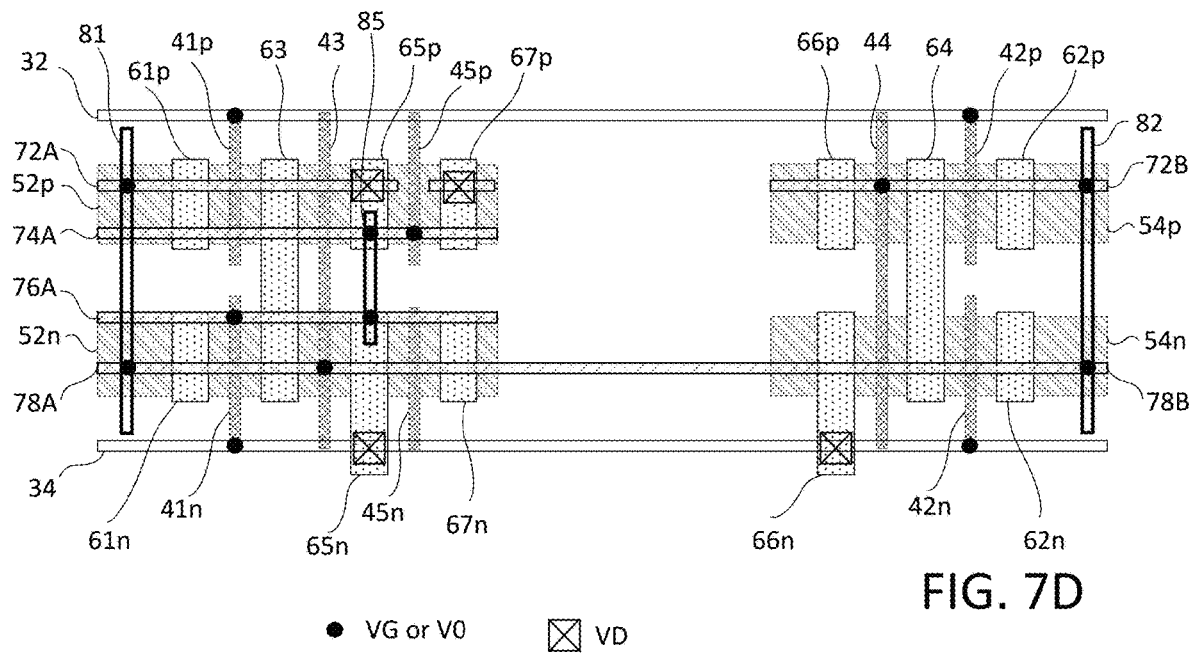

FIG. 7A is a schematic diagram of a cross-domain isolation circuit 170 that is a modification of the cross-domain isolation circuit 150 in FIG. 5A, in accordance with some embodiments. FIGS. 7B-7D are schematic diagrams of a layout design of the cross-domain isolation circuit 170 in FIG. 7A, in accordance with some embodiments.

In FIG. 7A, the active region connecting the p-type transistors T1p and T3p is conductively connected to the active region connecting the n-type transistors T1n and T3n. The active region connecting the p-type transistors T2p and T4p is conductively connected to the active region connecting the n-type transistors T2n and T4n. Specifically, in FIG. 7B-7D, the conductive segment 63 forms conductive contact with the active region between the transistors T1p and T3p over the p-type active zone and forms conductive contact with the active region between the transistors T1n and T3n over the n-type active zone. The conductive segment 64 forms conductive contact with the active region between the transistors T2p and T4p over the p-type active zone and forms conductive contact with the active region between the transistors T2n and T4n over the n-type active zone.

In FIG. 7A, the gate of the p-type transistors T3p and the gate of the n-type transistors T3n are conductively connected together. Specifically, in FIG. 7B-7D, the gate of the p-type transistors T3p and the gate of the n-type transistors T3n are conductively connected together by the gate-strip 43. When the gate-strip 43 is conductively connected to the horizontal routing line 78A through via VG, the gates of the p-type transistors T3p and the n-type transistors T3n are all connected to the node TIEH1 between the transistors T3p and T5p. Specifically, the horizontal routing line 78A is conductively connected to the node TIEH1 through the vertical routing line 81 and the horizontal routing line 72A.

In FIG. 7A, the gate of the p-type transistors T4p and the gate of the n-type transistors T4n are conductively connected together. Specifically, in FIG. 7B-7D, the gate of the p-type transistors T4p and the gate of the n-type transistors T4n are conductively connected together by the gate-strip 44. When the gate-strip 44 is conductively connected to the horizontal routing line 72B through via VG, the gates of the p-type transistors T4p and the n-type transistors T4n are all connected to the node TIEH1 between the transistors T3p and T5p. Specifically, the horizontal routing line 72B is conductively connected to the horizontal routing line 78A through the vertical routing line 82. The horizontal routing line 78A and the horizontal routing line 78B are conductively joint together. The horizontal routing line 78A is conductively connected to the node TIEH1 through the vertical routing line 81 and the horizontal routing line 72A.

In FIG. 7A, the semiconductor channel of the n-type transistor T3n has a first terminal conductively connected to a terminal of the semiconductor channel in the n-type transistor T1n. The semiconductor channel of the n-type transistor T3n has a second terminal held at the common lower supply voltage VSS. Specifically, in FIG. 7B-7D, the second terminal of the n-type transistor T3n forms conductive contact with the conductive segment 65n, which is conductively connected to the power rail 34 through via VD.

In FIG. 7A, the semiconductor channel of the n-type transistor T4n has a first terminal conductively connected to a terminal of the semiconductor channel in the n-type transistor T2n. The semiconductor channel of the n-type transistor T4n has a second terminal held at the common lower supply voltage VSS. Specifically, in FIG. 7B-7D, the second terminal of the n-type transistor T4n forms conductive contact with the conductive segment 66n, which is conductively connected to the power rail 34 through via VD.

Figure 8A:
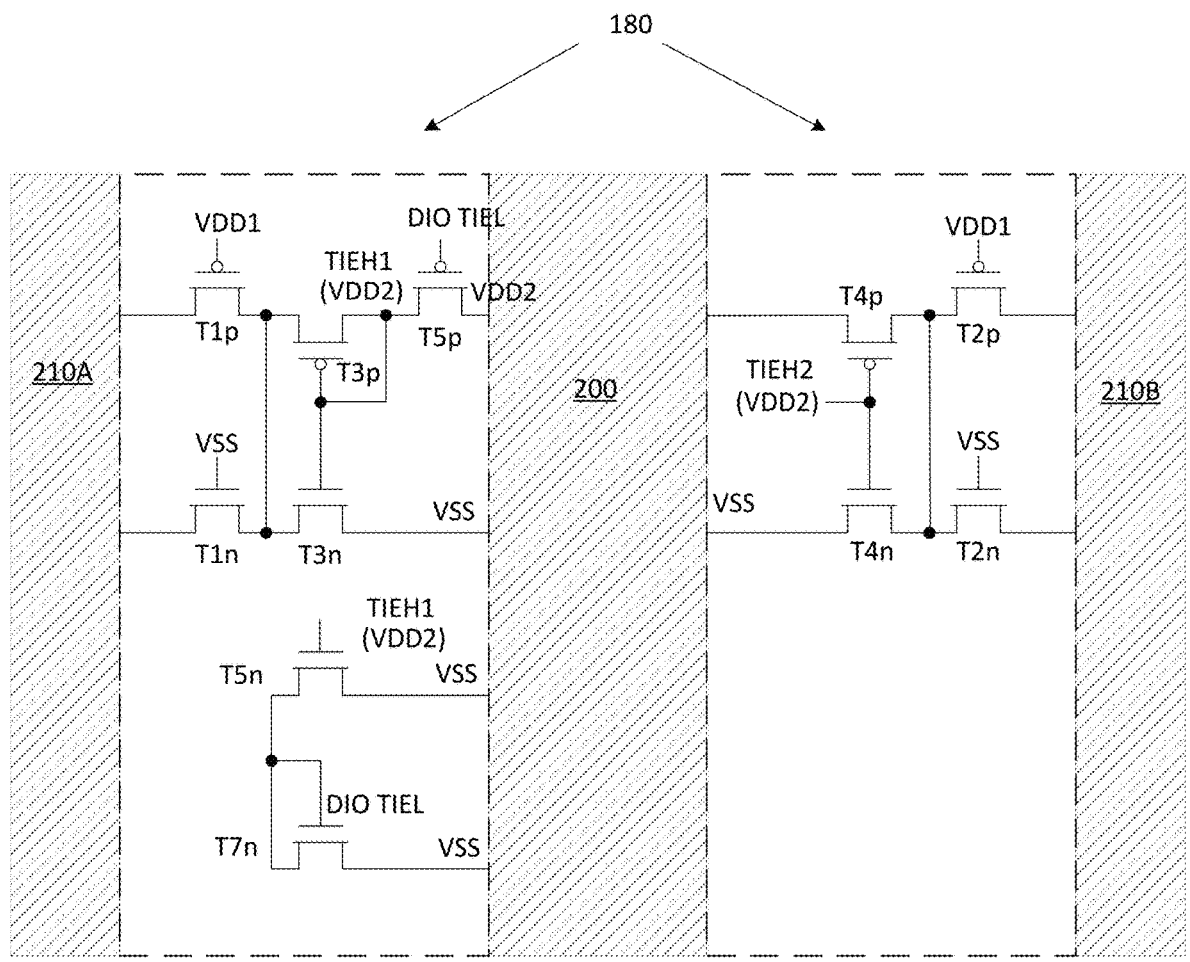
FIG. 8A is a schematic diagram of another cross-domain isolation circuit, in accordance with some embodiments.
Figure 8B:
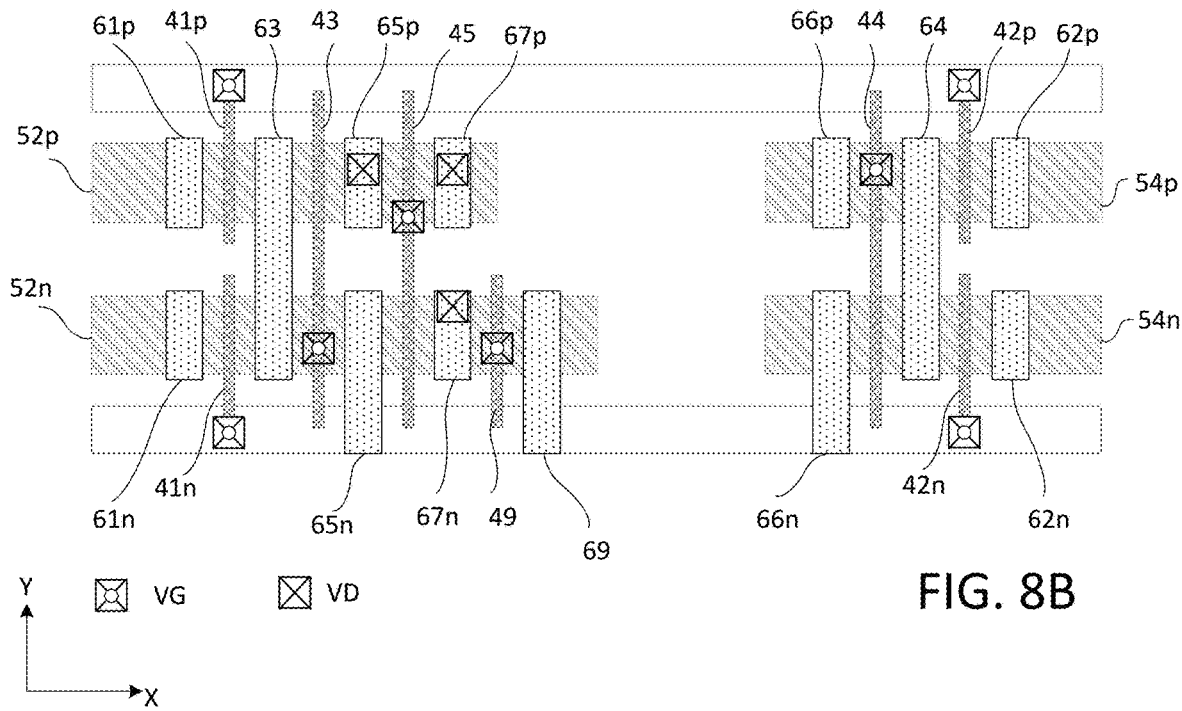
FIGS. 8B-8D are schematic diagrams of a layout design of the cross-domain isolation circuit of FIG. 8A, in accordance with some embodiments
Figure 8C:
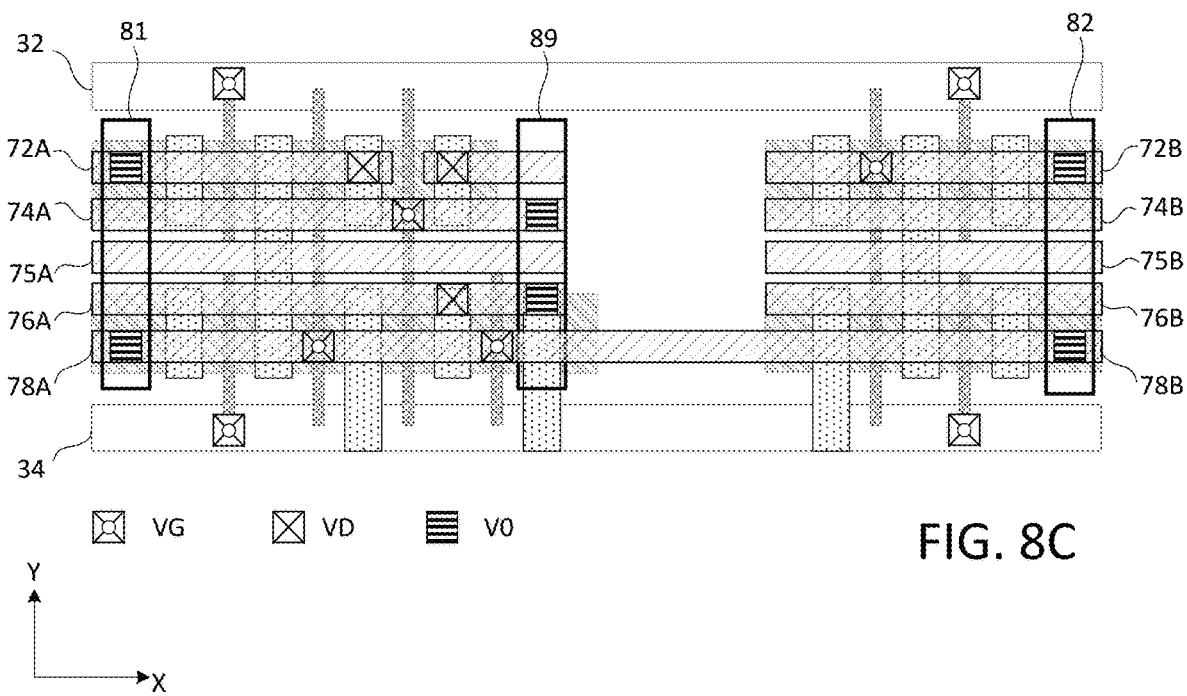
Figure 8D:
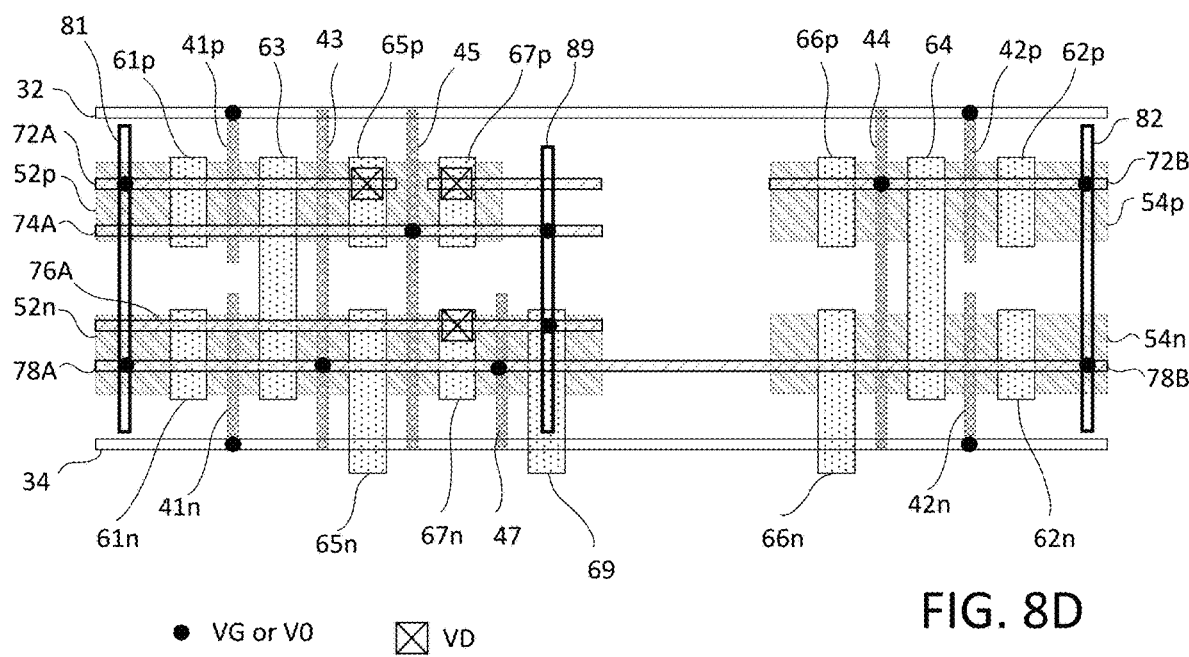

FIG. 8A is a schematic diagram of a cross-domain isolation circuit 180 that is a modification of the cross-domain isolation circuit 170 in FIG. 7A, in accordance with some embodiments. FIGS. 8B-8D are schematic diagrams of a layout design of the cross-domain isolation circuit 180 in FIG. 8A, in accordance with some embodiments.

In the cross-domain isolation circuit 180 of FIG. 8A, the gate of the p-type transistor T5p receives a DIO-TIEL voltage from the active region connecting the n-type transistors T5n and T7n. In contrast, the gate of the p-type transistor T5p in FIGS. 4A-7A is hold at the common lower supply voltage VSS. In FIG. 8B-8D, the DIO-TIEL voltage at the gate-strip 45 is received from the active region under the conductive segment 47n. The gate-strip 45 for the p-type transistor T5p is conductively connected to conductive segment 47n through various horizontal routing lines and vertical routing lines. Specifically, the gate-strip 45 is conductively connected to the horizontal routing line 74A through via VG. The horizontal routing line 74A is conductively connected to the vertical routing line 89 through via V0. The vertical routing line 89 is conductively connected to the horizontal routing line 76A through via V0. The horizontal routing line 76A is conductively connected to the conductive segment 67n, which is in conductive contact with the active region between the n-type transistors T5n and T7n in the first portion 52n of the n-type active zone.

In FIG. 8A, the gate of the n-type transistor T5n is conductively connected to the node TIEH1 between the transistors T3p and T5p, and the gate of the n-type transistor T7n is conductively connected to the node DIO-TIEL between the transistors T5n and T7n. Each of the transistors T5n and T7n has its semiconductor channel connected between the node DIO-TIEL and a corresponding node held at the common lower supply voltage VSS. In FIG. 8B-8D, the gate-strip 45 for both the n-type transistor T5n and the p-type transistor T5p is conductively connected to the horizontal routing line 74A through via VG. The horizontal routing line 74A is conductively connected to the node DIO-TIEL at the conductive segment 67n through the vertical routing line 89 and the horizontal routing line 76A. Each of the conductive segments 65n and 69n is conductively connected to the power rail 34 through via VD.

Figure 9A:
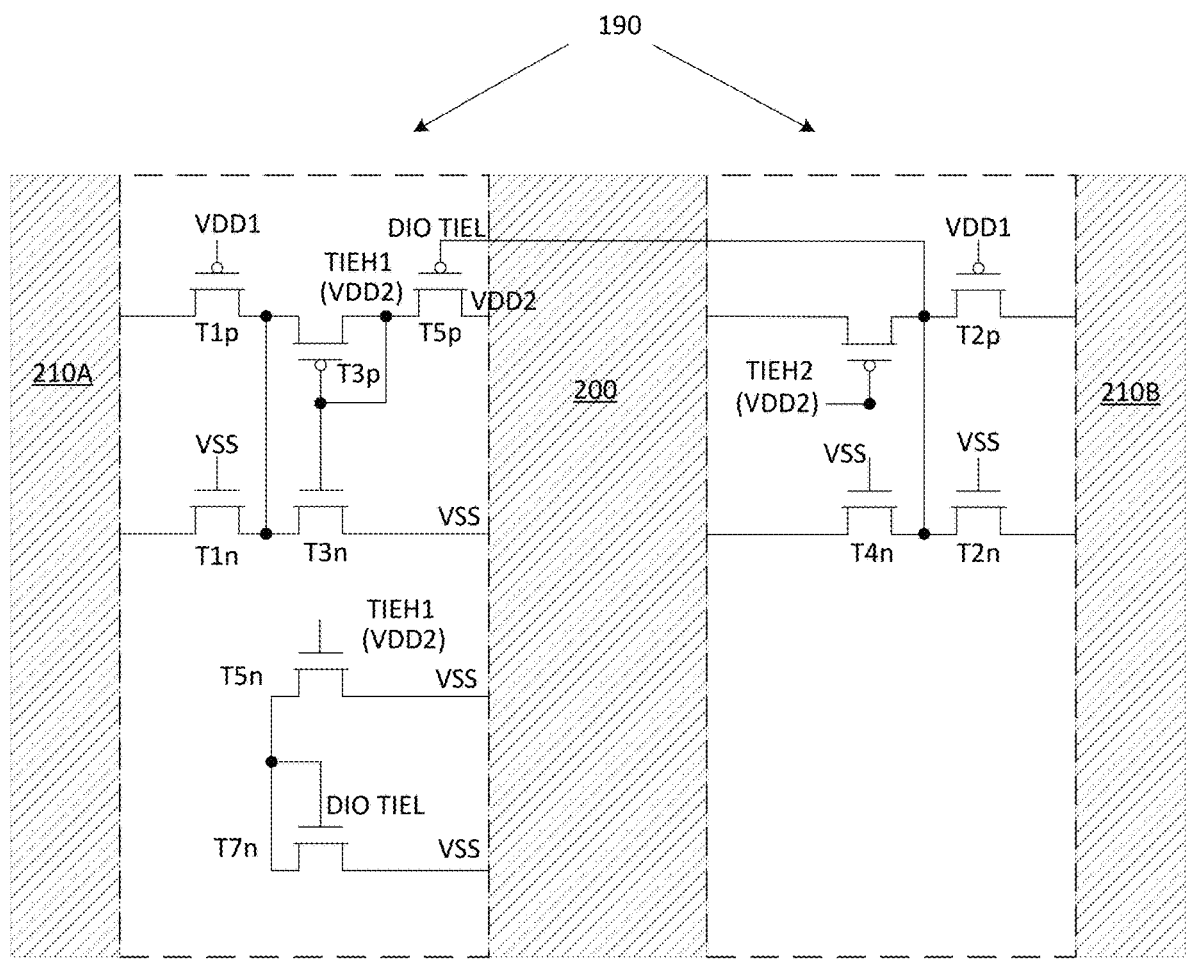
FIG. 9A is a schematic diagram of another cross-domain isolation circuit, in accordance with some embodiments.
Figure 9B:
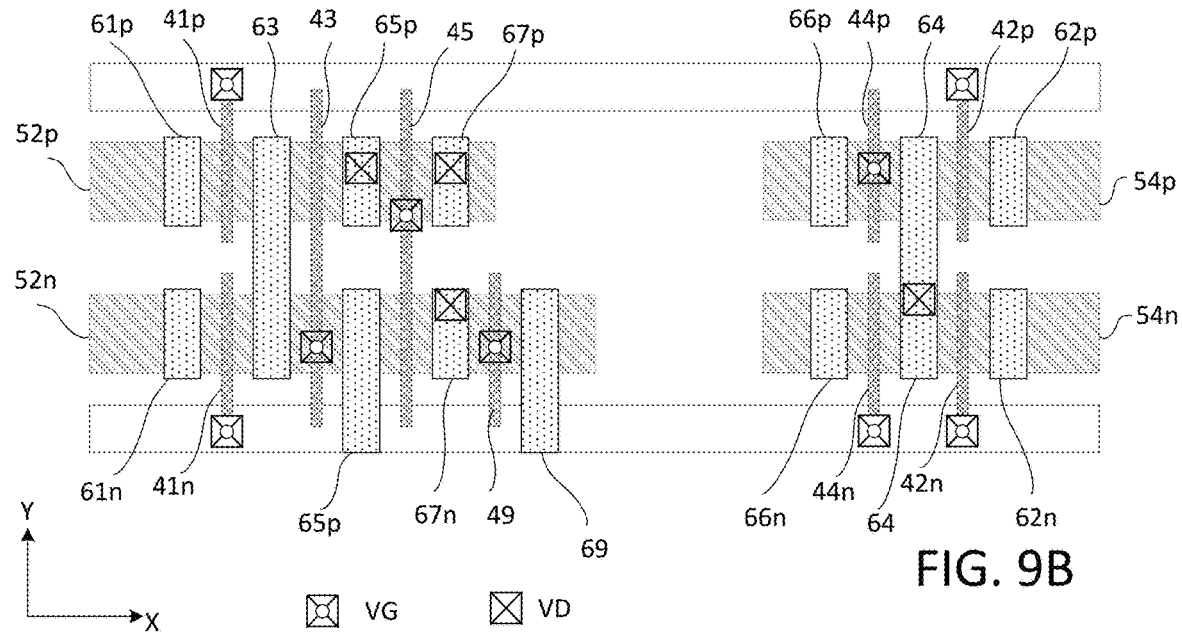
FIGS. 9B-9D are schematic diagrams of a layout design of the cross-domain isolation circuit of FIG. 9A, in accordance with some embodiments.
Figure 9C:
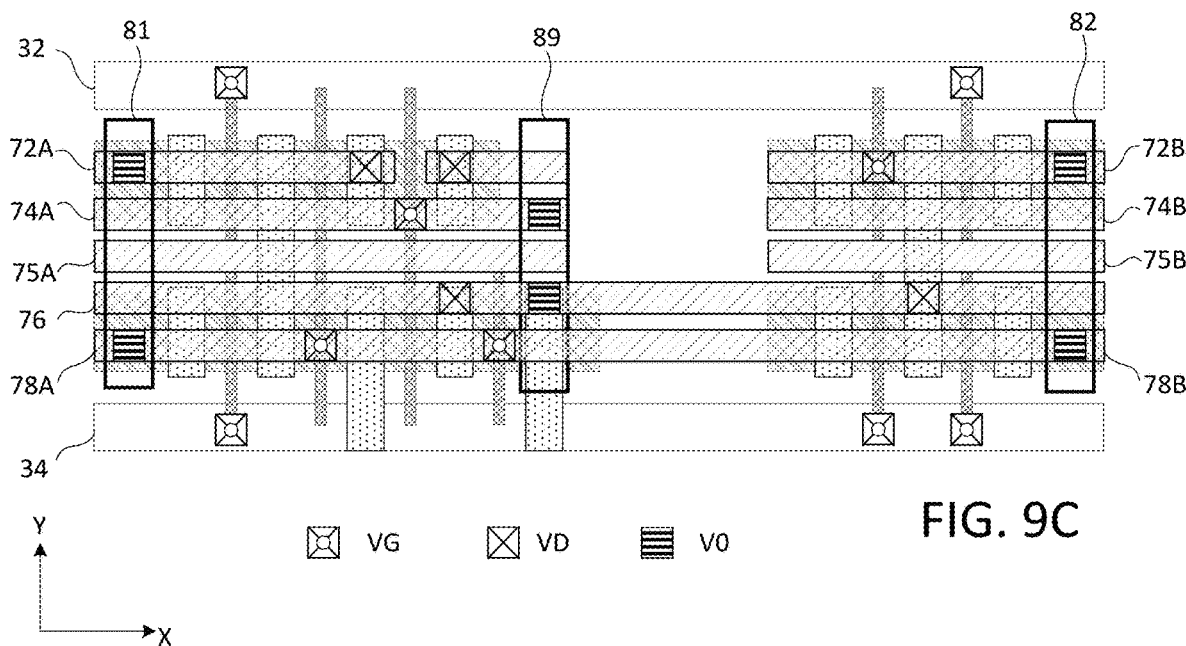
Figure 9D:
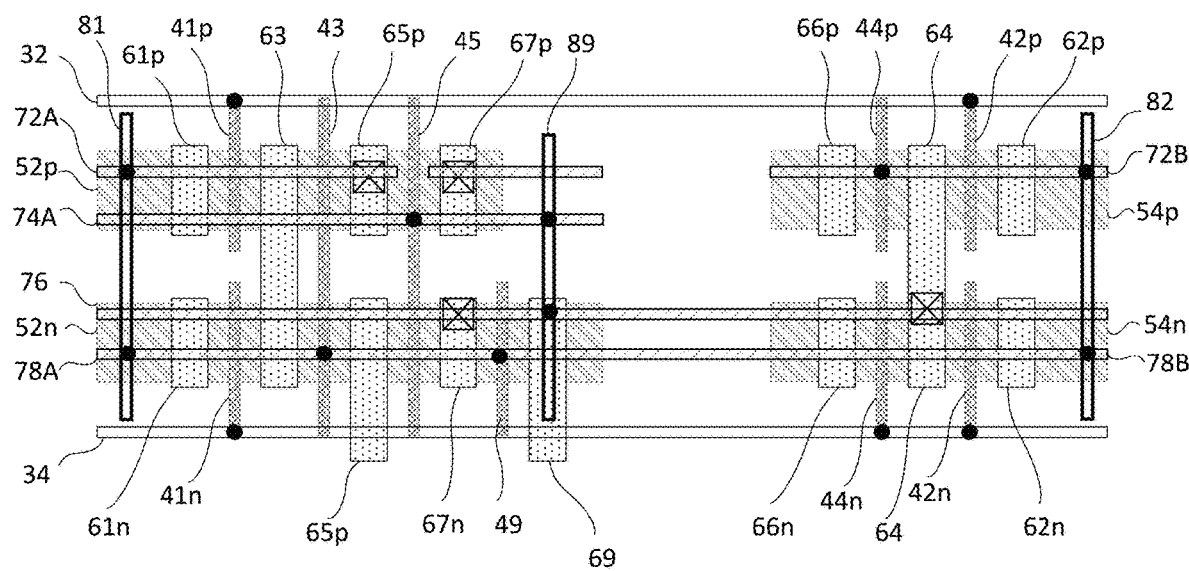

FIG. 9A is a schematic diagram of a cross-domain isolation circuit 190 that is a modification of the cross-domain isolation circuit 150 in FIG. 8A, in accordance with some embodiments. FIGS. 9B-9D are schematic diagrams of a layout design of the cross-domain isolation circuit 190 in FIG. 9A, in accordance with some embodiments.

In the cross-domain isolation circuit 190 of FIG. 9A, both the active region connecting the p-type transistors T2p and T4p and the active region connecting the n-type transistors T2n and T4n are held at a low voltage provided by the node DIO-TIEL between the transistors T5n and T7n. In contrast, the active region connecting the n-type transistors T2n and T4n in FIG. 8A is held at the common lower supply voltage VSS through the semiconducting channel of the n-type transistors T4n that is maintained at conducting state. FIG. 9A, the n-type transistor T4n is maintained at non-conducting state by the voltage VSS applied to its gate.

In FIG. 9B-9D, both the active region connecting the p-type transistors T2p and T4p and the active region connecting the n-type transistors T2n and T4n are in conductive contact with the conductive segment 64, which is conductively connected to the node DIO-TIEL at conductive segment 67n through the horizontal routing line 76. The conductive segment 67n is in conductive contact with the active region between the n-type transistors T2n and T4n in the first portion 52n of the n-type active zone.

Figure 10A:
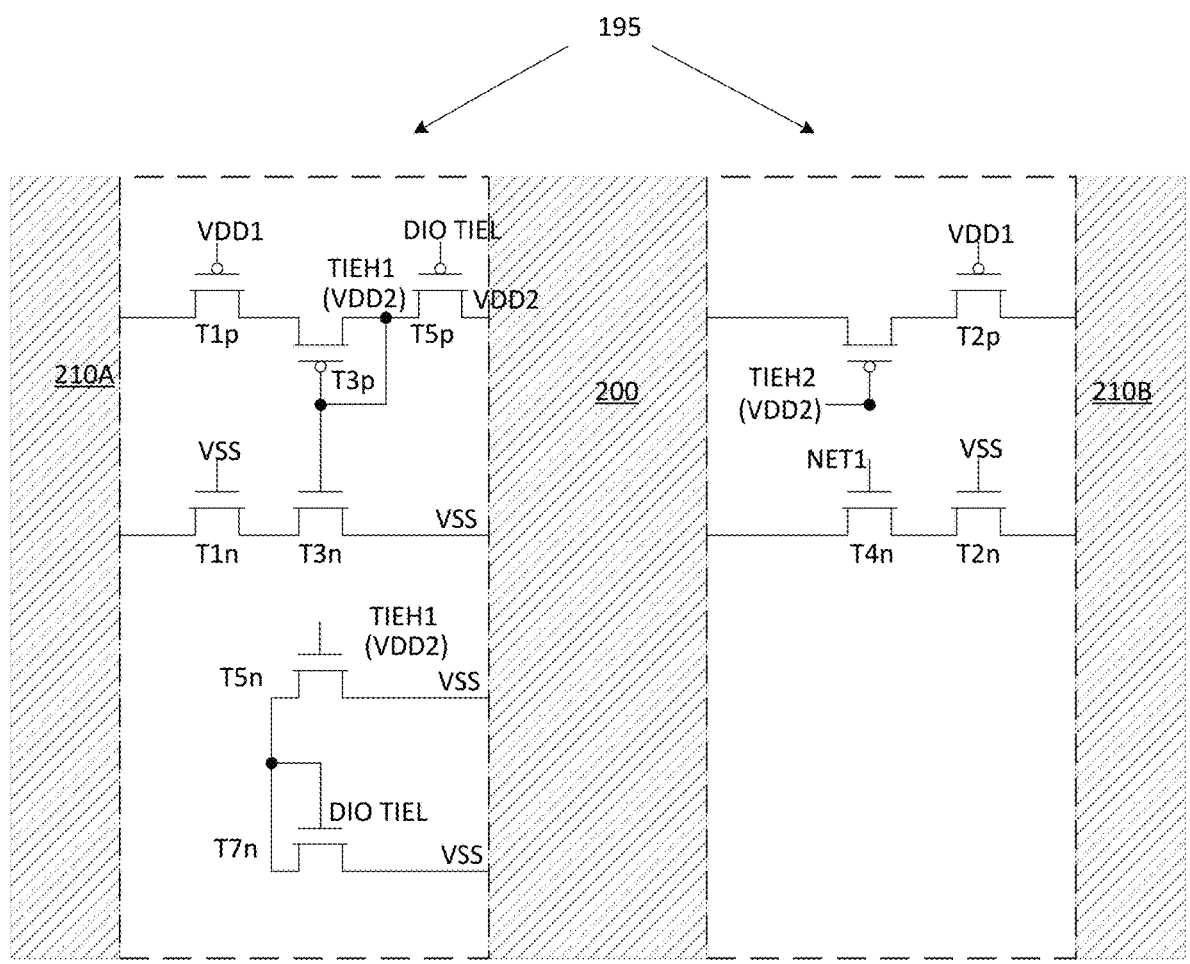
FIG. 10A is a schematic diagram of another cross-domain isolation circuit, in accordance with some embodiments.
Figure 10B:
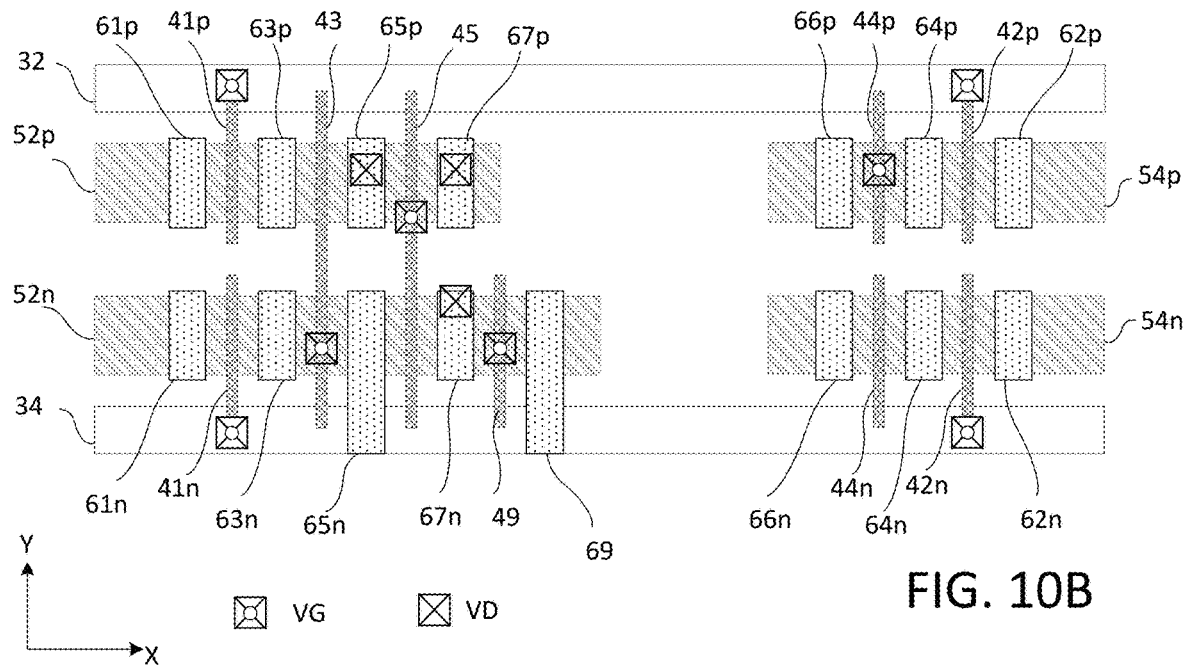
FIGS. 10B-10D are schematic diagrams of a layout design of the cross-domain isolation circuit of FIG. 10A, in accordance with some embodiments.
Figure 10C:
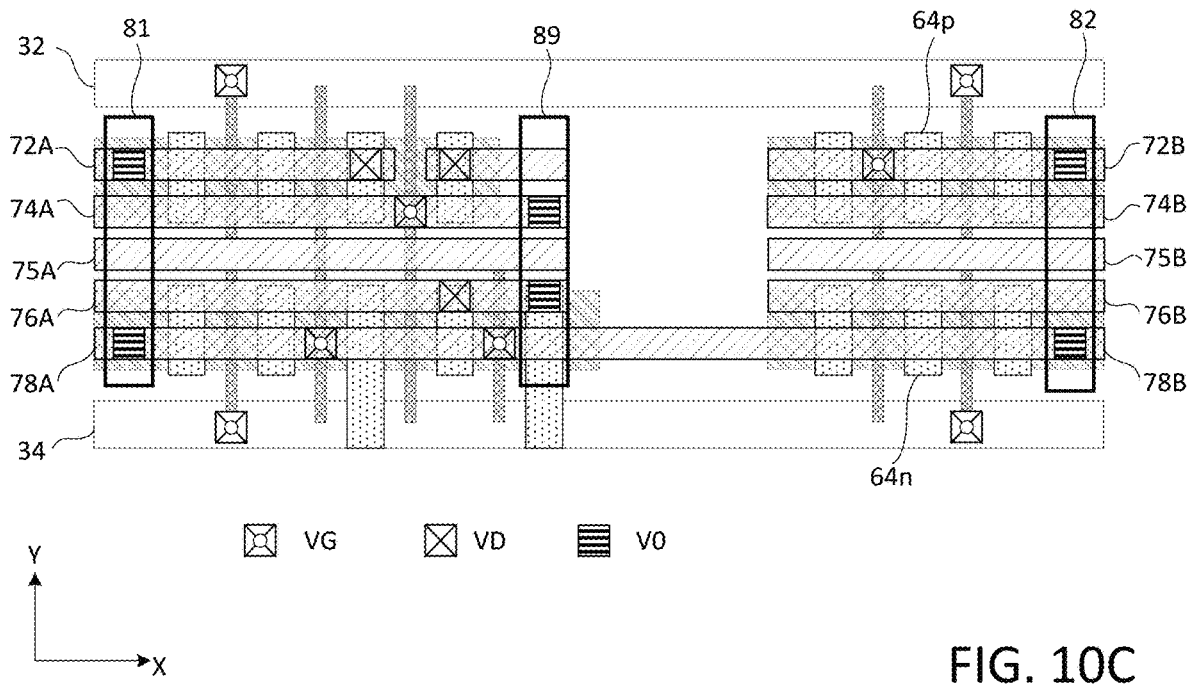
Figure 10D:
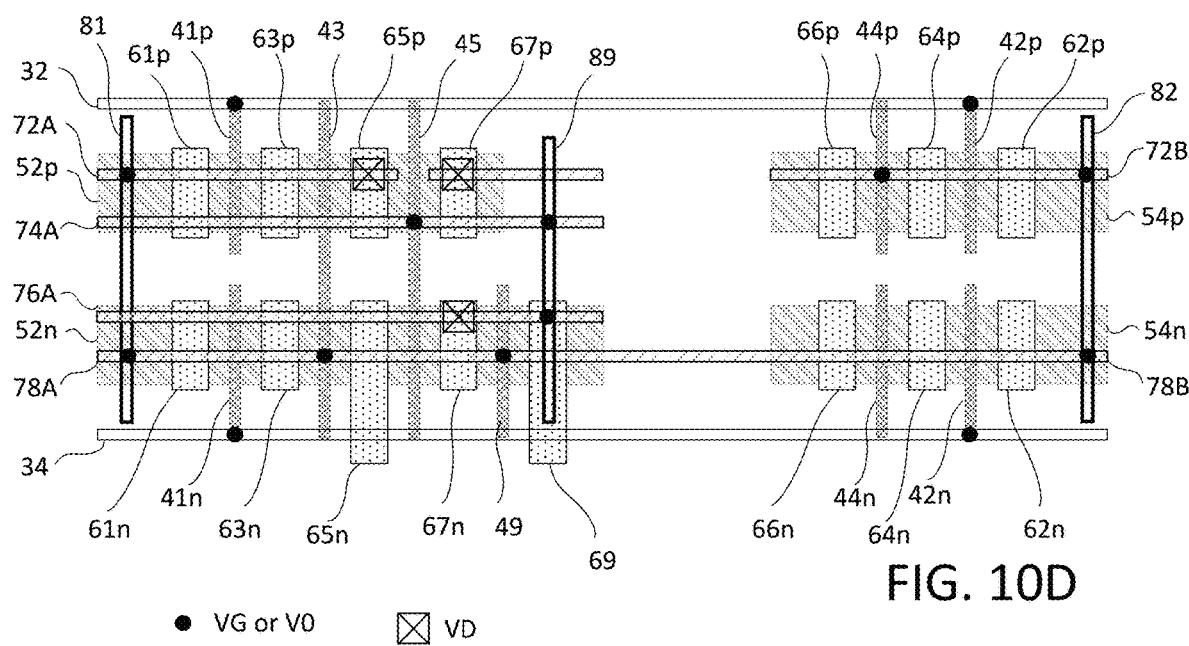

FIG. 10A is a schematic diagram of a cross-domain isolation circuit 195 that is a modification of the cross-domain isolation circuit 180 in FIG. 8A, in accordance with some embodiments. FIGS. 10B-10D are schematic diagrams of a layout design of the cross-domain isolation circuit 195 in FIG. 10A, in accordance with some embodiments.

In the cross-domain isolation circuit 195 of FIG. 10A, the active region connecting the p-type transistors T1p and T3p is not directly connected to the active region connecting the n-type transistors T1n and T3n, which is different from the circuit 180 of FIG. 8A. The active region connecting the p-type transistors T2p and T4p is not directly connected to the active region connecting the n-type transistors T2n and T4n, which is different from the circuit 180 of FIG. 8A. In FIGS. 10B-10D, the conductive segment 63p between the p-type transistors T1p and T3p is not directly connected to the conductive segment 63n between the n-type transistors T1n and T3n. The conductive segment 64p between the p-type transistors T2p and T4p is not directly connected to the conductive segment 64n between the n-type transistors T2n and T4n.

In the cross-domain isolation circuit 195 of FIG. 10A, the gate of the p-type transistor T4p is not directly connected to the gate of the n-type transistor T4n. In FIGS. 10B-10D, the gate-strip 44p for the p-type transistor T4p is not directly connected to the gate-strip 44n for the gate of the n-type transistor T4n. In some embodiments, the gate of the n-type transistors T2n is connected to the common lower supply voltage VSS. In some embodiments, the gate of the n-type transistors T2n is connected to some signal NET1.

Figure 11A:
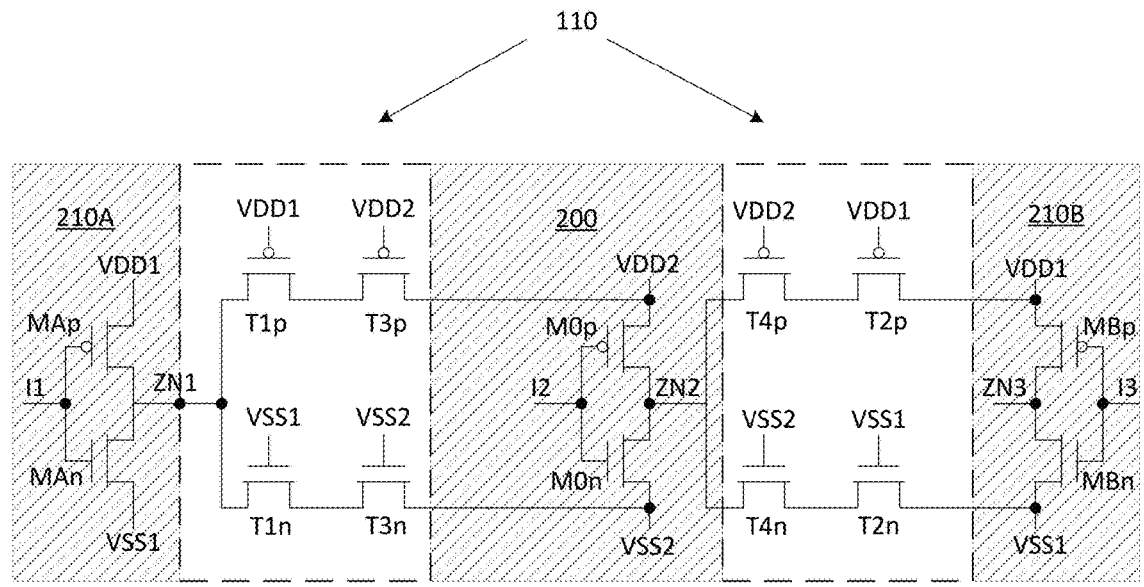
FIG. 11A is a schematic diagram of a cross-domain isolation circuit and three example circuits in different power domains that are isolated by another cross-domain isolation circuit, in accordance with some embodiments.
Figure 11B:
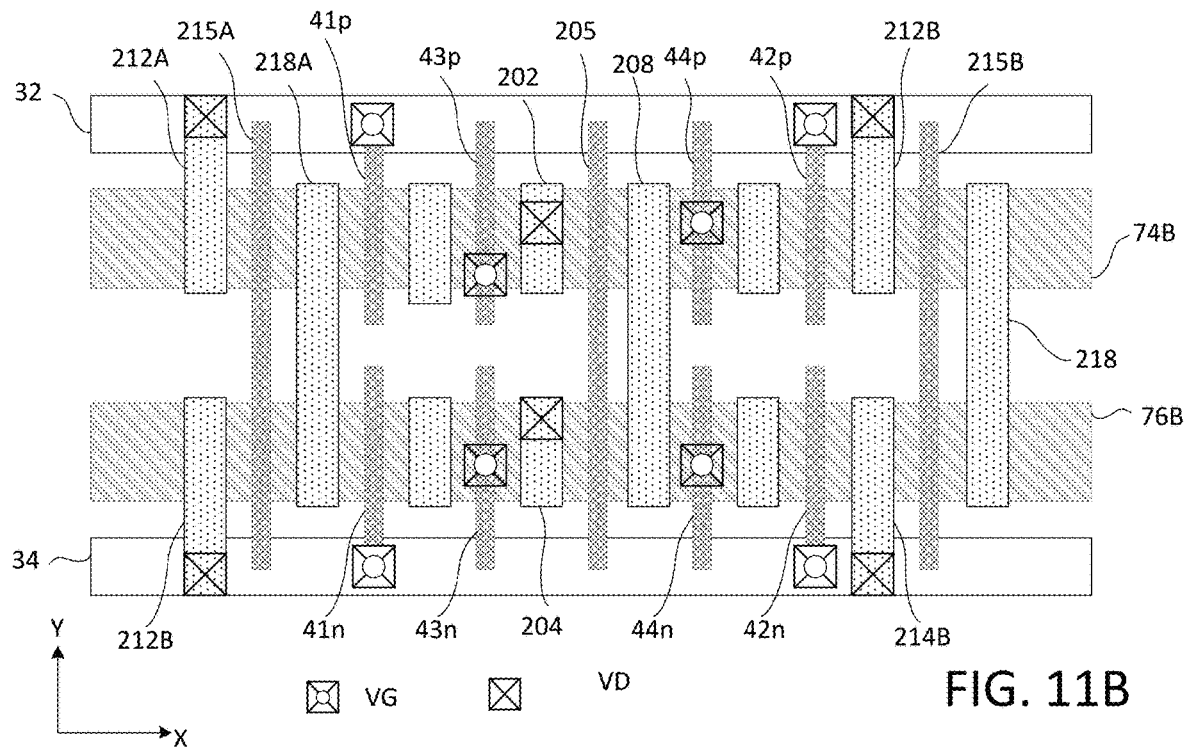
FIGS. 11B-11D are schematic diagrams of a layout design of the cross-domain isolation circuit and the three example circuits of FIG. 11A, in accordance with some embodiments.
Figure 11C:
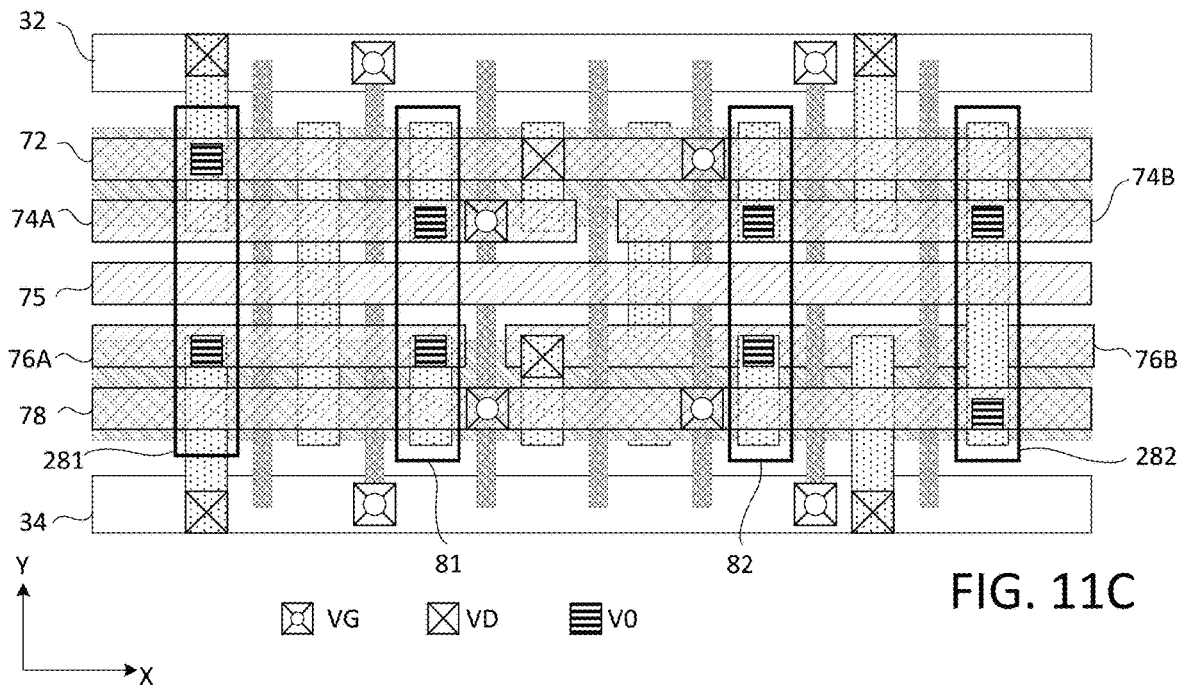
Figure 11D:
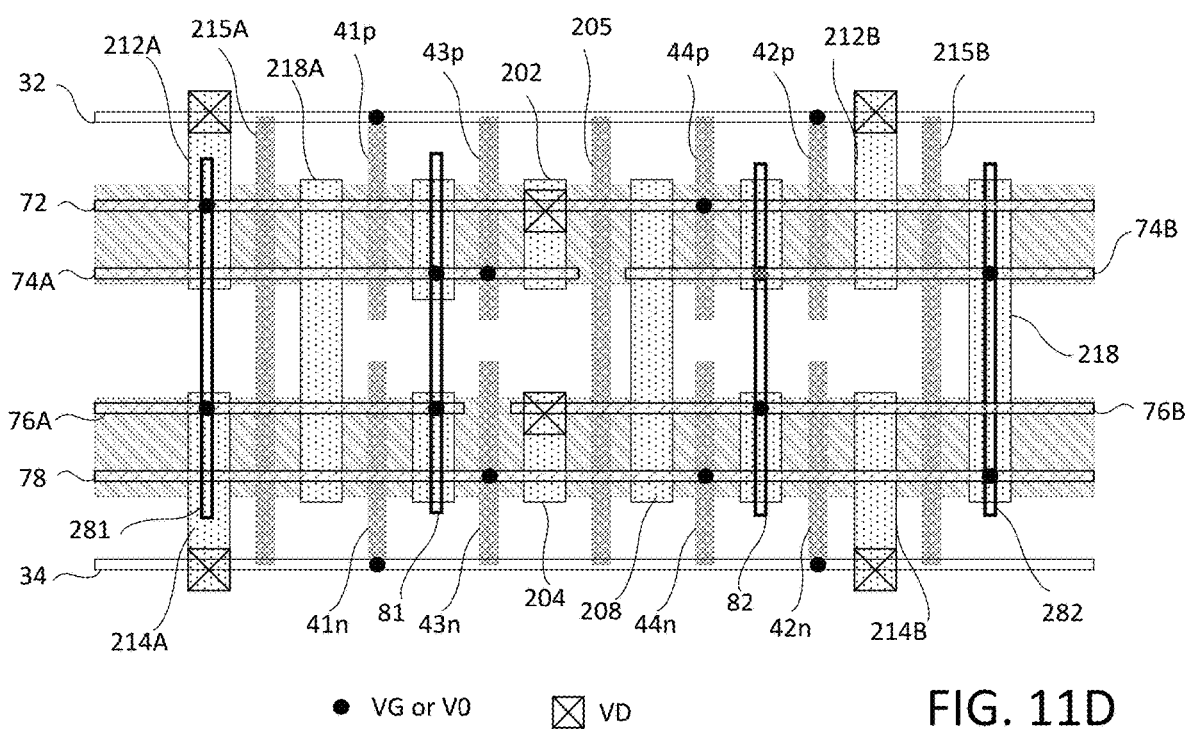

FIG. 11A is a schematic diagram of a cross-domain isolation circuit 110 and three example circuits (e.g., 200, 210A, and 210B) in different power domains that are isolated by the cross-domain isolation circuit 110, in accordance with some embodiments. FIGS. 11B-11D are schematic diagrams of a layout design of the cross-domain isolation circuit 110 and the three example circuits (e.g., 200, 210A, and 210B) in FIG. 11A, in accordance with some embodiments.

In FIG. 11A, each of the three example circuits (e.g., 200, 210A, and 210B) is an inverter gate. In FIGS. 11B-11D, the layout for the three example circuits include gate-strips (205, 215A, and 215B) and conductive segments (e.g., 208, 218A, 218B, 202, 212A, 212B, 204, 214A, 214B) extending in the Y-direction.

In FIG. 11A, the inverter in the circuit 210A includes p-type transistor MAp and n-type transistor MAn. The source of the transistor MAp and the source of the transistor MAn are correspondingly connected to the upper supply voltage VDD1 and the lower supply voltage VSS1. The drain of the transistor MAp and the drain of the transistor MAn are conductively connected together. In FIGS. 11B-11D, the source of the transistor MAp is in conductive contact with the conductive segment 212A which is conductively connected to the power rail 32. The source of the transistor MAn is in conductive contact with the conductive segment 214A which is conductively connected to the power rail 34. The drain of the transistor MAp and the drain of the transistor MAn are in conductive contact with the conductive segment 218A.

In FIG. 11A, the inverter in the circuit 210B includes p-type transistor MBp and n-type transistor MBn. The source of the transistor MBp and the source of the transistor MBn are correspondingly connected to the upper supply voltage VDD1 and the lower supply voltage VSS1. The drain of the transistor MBp and the drain of the transistor MBn are conductively connected together. In FIGS. 11B-11D, the source of the transistor MBp is in conductive contact with the conductive segment 212B which is conductively connected to the power rail 32. The source of the transistor MBn is in conductive contact with the conductive segment 214B which is conductively connected to the power rail 34. The drain of the transistor MBp and the drain of the transistor MBn are in conductive contact with the conductive segment 218B.

In FIG. 11A, the inverter in the circuit 200 includes p-type transistor M0p and n-type transistor M0n. The source of the transistor M0p and the source of the transistor M0n are correspondingly connected to the upper supply voltage VDD2 and the power supply VSS2. The drain of the transistor M0p and the drain of the transistor M0n are conductively connected together. In FIGS. 11B-11D, the horizontal routing line 72 and the horizontal routing line 78 are correspondingly conducted with the lower supply voltage VSS2 and the power supply VSS2. The drain of the transistor M0p and the drain of the transistor M0n are in conductive contact with the conductive segment 208. The source of the transistor M0p is in conductive contact with the conductive segment 202 which is conductively connected to the horizontal routing line 72 through via VD. The source of the transistor M0n is in conductive contact with the conductive segment 204. The conductive segment 204 is conductively connected to the horizontal routing line 78 through the horizontal routing line 76B, the vertical routing line 82, the horizontal routing line 74B, and the vertical routing line 282.

In FIGS. 11B-11D, the gate-strip 43n for the transistor T3n and the gate-strip 44n for the transistor T4n are conductively connected to the horizontal routing line 78 through vias VG. The gate-strip 43p for the transistor T3p is conductively connected to the horizontal routing line 72 through the horizontal routing line 74A, the vertical routing line 81, the horizontal routing line 76A, and the vertical routing line 281. The gate-strip 43p for the transistor T3p is conductively connected to the horizontal routing line 72 through VG.

In general, a cross-domain isolation circuit includes type-one transistors in a type-one active zone and type-two transistors in a type-two active zone. In the embodiments of FIGS. 4A-4D, 5A-5D, FIGS. 6A-6D, 7A-7D, FIGS. 8A-8D, 9A-9D, and 10A-10D, p-type transistors are used as the type-one transistors and n-type transistors are used as the type-two transistors. In alternative embodiments, n-type transistors are used as the type-one transistors and p-type transistors are used as the type-two transistors.

For example, when each p-type transistor in FIGS. 4A-10A is substituted with a corresponding n-type transistor and each n-type transistor in FIGS. 4A-10A is substituted with a corresponding p-type transistor, embodiments of a corresponding cross-domain isolation circuit using n-type transistors as the type-one transistors and p-type transistors as the type-two transistor are obtained. In the embodiments of FIGS. 4A-10A, for the power supplies, an upper supply voltage is used as a first supply voltage and a lower supply voltage is used as a second supply voltage. In the embodiments of a corresponding cross-domain isolation circuit using n-type transistors as the type-one transistors and p-type transistors, a lower supply voltage is used as a first supply voltage and an upper supply voltage is used as a second supply voltage.

Figure 12:
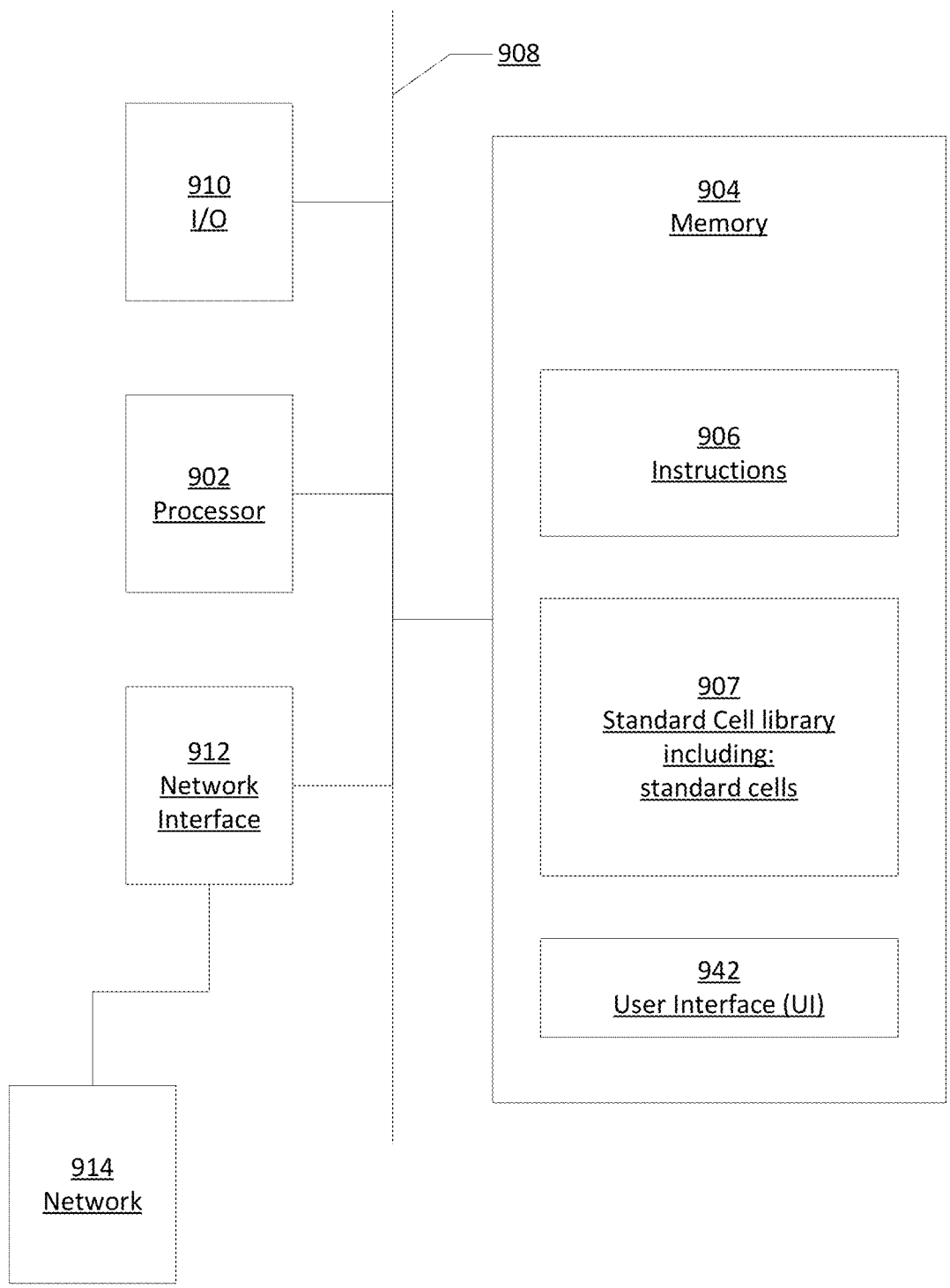
FIG. 12 is a block diagram of an electronic design automation (EDA) system in accordance with some embodiments.

FIG. 12 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902.

Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
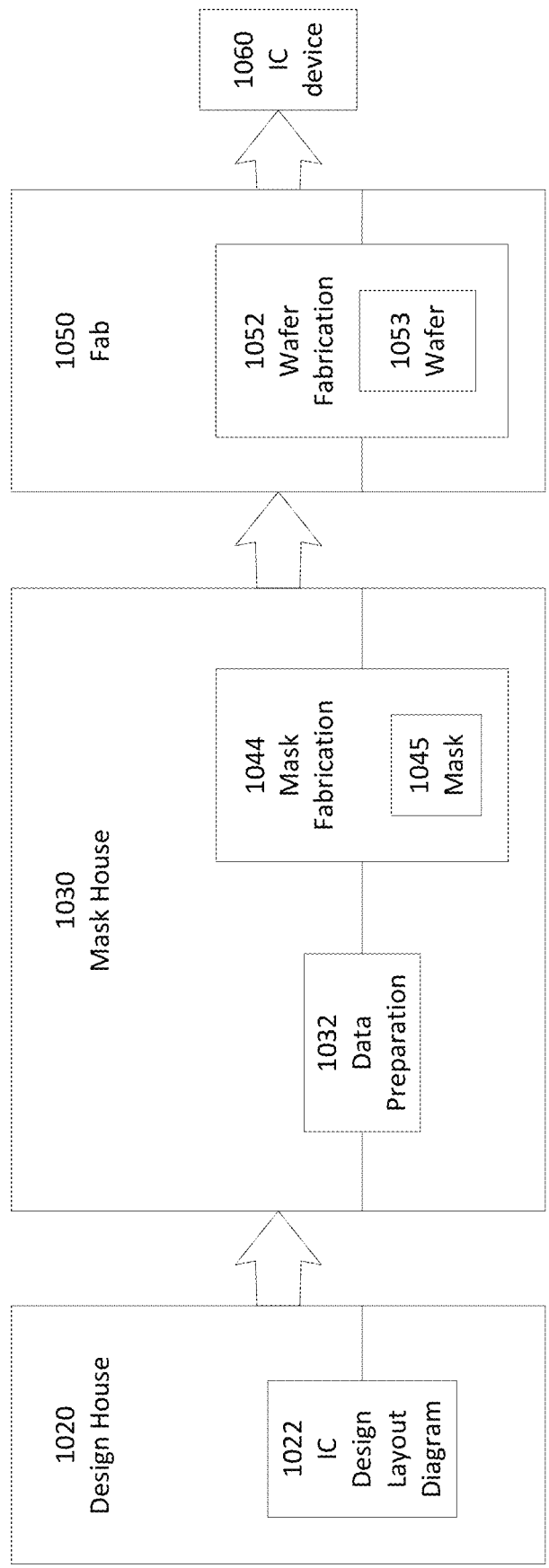
FIG. 13 is a block diagram of an integrated circuit (IC) manufacturing system, and an IC manufacturing flow associated therewith, in accordance with some embodiments.

FIG. 13 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 13, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 13, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a type-one active zone and a type-two active zone forming two parallel active zones each extending in a first direction. The integrated circuit includes a first type-one transistor in a first portion of the type-one active zone, a second type-one transistor in a second portion of the type-one active zone, a first type-two transistor in a first portion of the type-two active zone, a second type-two transistor in a second portion of the type-two active zone, a third type-one transistor in the first portion of the type-one active zone, a fourth type-one transistor in the second portion of the type-one active zone, and a fifth type-one transistor in the first portion of the type-one active zone. The first type-one transistor has a gate configured to have a first supply voltage of a first power supply. The second type-one transistor has a semiconductor channel configured to be at a non-conductive state. The first type-two transistor has a gate configured to have a second supply voltage of the first power supply. The second type-two transistor has a semiconductor channel configured to be at a non-conductive state. The third type-one transistor has a first active-region conductively connected with an active-region of the first type-one transistor, the third type-one transistor has a second active-region and a gate conductively connected to each other. The fourth type-one transistor has a first active-region conductively connected with an active-region of the second type-one transistor. The fifth type-one transistor has a first active-region conductively connected with the gate of the third type-one transistor and has a second active-region configured to have a first supply voltage of a second power supply, and the fifth type-one transistor is configured to be at a conducting state.

Another aspect of this description relates to an integrated circuit. In some embodiments, the integrated circuit includes a type-one active zone and a type-two active zone forming two parallel active zones each extending in a first direction. The integrated circuit includes a first type-one transistor in a first portion of the type-one active zone, a first type-two transistor in a first portion of the type-two active zone, a third type-one transistor in the first portion of the type-one active zone, and a fifth type-one transistor in the first portion of the type-one active zone. The first type-one transistor has a gate configured to have a first supply voltage of a first power supply. The first type-two transistor has a gate configured to have a second supply voltage of the first power supply. The third type-one transistor has a first active-region conductively connected with an active-region of the first type-one transistor, the third type-one transistor has a second active-region and a gate conductively connected to each other. The fifth type-one transistor has a first active-region conductively connected with the gate of the third type-one transistor and has a second active-region configured to have a first supply voltage of a second power supply, and the fifth type-one transistor is configured to be at a conducting state.

Still another aspect of this description relates to a method of forming an integrated circuit. In some embodiments, the method includes generating, by a processor, a layout design of the integrated circuit. The generating the layout design incudes generating a type-one active zone pattern and a type-two active zone pattern correspondingly specifying a type-one active zone and a type-two active zone forming two parallel active zones each extending in a first direction. The generating the layout design also includes generating a first gate-strip pattern intersecting the type-one active zone pattern to specify a first type-one transistor having a gate configured to have a first supply voltage of a first power supply, and generating a second gate-strip pattern intersecting the type-two active zone to specify a first type-two transistor having a gate configured to have a second supply voltage of the first power supply. The generating the layout design also includes generating a third gate-strip pattern intersecting the type-one active zone pattern to specify a third type-one transistor having a first active-region conductively connected with an active-region of the first type-one transistor and having a second active-region conductively connected to and a gate of the third type-one transistor. The generating the layout design still includes generating a fourth gate-strip pattern intersecting the type-one active zone pattern to specify a fifth type-one transistor having a first active-region conductively connected with the gate of the third type-one transistor and having a second active-region configured to have a first supply voltage of a second power supply, and wherein the fifth type-one transistor is configured to be at a conducting state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
a type-one active zone and a type-two active zone forming two parallel active zones each extending in a first direction;
a first type-one transistor in a first portion of the type-one active zone and having a gate configured to have a first supply voltage of a first power supply;
a second type-one transistor in a second portion of the type-one active zone and having a semiconductor channel configured to be at a non-conductive state;
a first type-two transistor in a first portion of the type-two active zone and having a gate configured to have a second supply voltage of the first power supply;
a second type-two transistor in a second portion of the type-two active zone and having a semiconductor channel configured to be at a non-conductive state;
a third type-one transistor in the first portion of the type-one active zone and having a first active-region conductively connected with an active-region of the first type-one transistor, the third type-one transistor having a second active-region and a gate conductively connected to each other;
a fourth type-one transistor in the second portion of the type-one active zone and having a first active-region conductively connected with an active-region of the second type-one transistor; and
a fifth type-one transistor in the first portion of the type-one active zone, wherein the fifth type-one transistor has a first active-region conductively connected with the gate of the third type-one transistor and has a second active-region configured to have a first supply voltage of a second power supply, and wherein the fifth type-one transistor is configured to be at a conducting state.

2. The integrated circuit of claim 1, wherein the fourth type-one transistor has a gate configured to have the first supply voltage of the second power supply.

3. The integrated circuit of claim 1, wherein the fourth type-one transistor has a gate configured to have a first supply voltage of a third power supply.

4. The integrated circuit of claim 1, wherein the fourth type-one transistor has a second active-region and a gate conductively connected to each other, further comprising:
a sixth type-one transistor in the second portion of the type-one active zone, wherein the sixth type-one transistor has a first active-region conductively connected with the gate of the fourth type-one transistor and has a second active-region configured to have the first supply voltage of the second power supply, and wherein the sixth type-one transistor is configured to be at a conducting state.

5. The integrated circuit of claim 1, further comprising:
a third type-two transistor in the first portion of the type-two active zone;
a fourth type-two transistor in the second portion of the type-two active zone; and wherein the third type-two transistor has a first active-region conductively connected with an active-region of the first type-two transistor, and wherein the fourth type-two transistor has a first active-region conductively connected with an active-region of the second type-two transistor.

6. The integrated circuit of claim 5, wherein each of the third type-two transistor and the fourth type-two transistor has a gate, wherein the gate of the third type-two transistor, the gate of the fourth type-two transistor, or both of the gate of the third type-two transistor and the gate of the fourth type-two transistor is configured to have a second supply voltage of the second power supply.

7. The integrated circuit of claim 5, wherein each of the third type-two transistor and the fourth type-two transistor has a gate, wherein the gate of the third type-one transistor is conductively connected to the gate of the third type-two transistor, connected to the gate of the fourth type-two transistor, or connected to both the gate of the third type-two transistor and the gate of the fourth type-two transistor.

8. The integrated circuit of claim 5, further comprising:
a conductive line connecting the first active-region of the third type-one transistor, the third type-two transistor, the fourth type-two transistor, and the fourth type-one transistor.

9. The integrated circuit of claim 1, wherein the type-one active zone is a p-type active zone and the type-two active zone is an n-type active zone, wherein each of the type-one transistors is a p-type transistor and each of the type-two transistors is an n-type transistor, and wherein the first supply voltage of the first power supply is higher than the second supply voltage of the first power supply.

10. The integrated circuit of claim 1, wherein the type-one active zone is an n-type active zone and the type-two active zone is a p-type active zone, wherein each of the type-one transistors is an n-type transistor and each of the type-two transistors is a p-type transistor, and wherein the first supply voltage of the first power supply is lower than the second supply voltage of the first power supply.

11. An integrated circuit comprising:
a type-one active zone and a type-two active zone forming two parallel active zones each extending in a first direction;
a first type-one transistor in a first portion of the type-one active zone and having a gate configured to have a first supply voltage of a first power supply;
a first type-two transistor in a first portion of the type-two active zone and having a gate configured to have a second supply voltage of the first power supply;
a second type-one transistor in the first portion of the type-one active zone and having a first active-region conductively connected with an active-region of the first type-one transistor, the second type-one transistor having a second active-region and a gate conductively connected to each other; and
a third type-one transistor in the first portion of the type-one active zone, wherein the third type-one transistor has a first active-region conductively connected with the gate of the second type-one transistor and has a second active-region configured to have a first supply voltage of a second power supply, and wherein the third type-one transistor is configured to be at a conducting state.

12. The integrated circuit of claim 11, further comprising:
a second type-two transistor in the first portion of the type-two active zone; and
wherein the second type-two transistor has a first active-region conductively connected with an active-region of the first type-two transistor.

13. The integrated circuit of claim 12, wherein a gate of the second type-two transistor is configured to have a second supply voltage of the second power supply.

14. The integrated circuit of claim 12, wherein a gate of the second type-one transistor is conductively connected to the gate of the second type-two transistor.

15. The integrated circuit of claim 12, further comprising:
a conductive line connecting the first active-region of the second type-one transistor and the first active-region of the second type-two transistor.

16. The integrated circuit of claim 11, wherein the type-one active zone is a p-type active zone and the type-two active zone is an n-type active zone, wherein each of the type-one transistors is a p-type transistor and each of the type-two transistors is an n-type transistor, and wherein the first supply voltage of the first power supply is higher than the second supply voltage of the first power supply.

17. The integrated circuit of claim 11, wherein the type-one active zone is an n-type active zone and the type-two active zone is a p-type active zone, wherein each of the type-one transistors is an n-type transistor and each of the type-two transistors is a p-type transistor, and wherein the first supply voltage of the first power supply is lower than the second supply voltage of the first power supply.

18. A method of forming an integrated circuit, the method comprising generating, by a processor, a layout design of the integrated circuit, wherein generating the layout design comprises:
generating a type-one active zone pattern and a type-two active zone pattern correspondingly specifying a type-one active zone and a type-two active zone forming two parallel active zones each extending in a first direction;
generating a first gate-strip pattern intersecting the type-one active zone pattern to specify a first type-one transistor having a gate configured to have a first supply voltage of a first power supply;
generating a second gate-strip pattern intersecting the type-two active zone to specify a first type-two transistor having a gate configured to have a second supply voltage of the first power supply;
generating a second gate-strip pattern intersecting the type-one active zone pattern to specify a second type-one transistor having a first active-region conductively connected with an active-region of the first type-one transistor and having a second active-region conductively connected to and a gate of the second type-one transistor; and
generating a fourth third gate-strip pattern intersecting the type-one active zone pattern to specify a third type-one transistor having a first active-region conductively connected with the gate of the second type-one transistor and having a second active-region configured to have a first supply voltage of a second power supply, and wherein the third type-one transistor is configured to be at a conducting state.

19. The method of claim 18, further comprising:
generating a fifth gate-strip pattern intersecting the type-two active zone to specify a second type-two transistor having a first active-region conductively connected with an active-region of the first type-two transistor.

20. The method of claim 19, wherein the second gate-strip pattern is jointed with the fifth fourth gate-strip pattern to specify a gate of the second type-one transistor is conductively connected to a gate of the second type-two transistor.

* * * * *